United States Patent
Kundu et al.

(10) Patent No.: US 12,362,758 B2
(45) Date of Patent: Jul. 15, 2025

(54) HIGH-SPEED DIGITAL-TO-ANALOG CONVERTER CALIBRATION

(71) Applicant: Intel Corporation, Santa Clara, CA (US)

(72) Inventors: Somnath Kundu, Hillsboro, OR (US); Amy Whitcombe, Saratoga, CA (US); Stefano Pellerano, Beaverton, OR (US); Brent R. Carlton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 656 days.

(21) Appl. No.: 17/561,457

(22) Filed: Dec. 23, 2021

(65) Prior Publication Data

US 2023/0208430 A1  Jun. 29, 2023

(51) Int. Cl.
    *H03M 1/10* (2006.01)
(52) U.S. Cl.
    CPC .................. *H03M 1/1019* (2013.01)
(58) Field of Classification Search
    CPC ...... H03M 1/10; H03M 1/1009; H03M 1/742; H03M 1/0836; H03M 1/1019
    See application file for complete search history.

(56) References Cited

U.S. PATENT DOCUMENTS

| | | | | |
|---|---|---|---|---|
| 5,926,123 | A * | 7/1999 | Ostrom | H03M 1/0641 |
| | | | | 341/120 |
| 8,130,888 | B2 * | 3/2012 | Eldredge | H04L 7/033 |
| | | | | 375/326 |
| 8,576,103 | B2 * | 11/2013 | Currivan | H04B 1/10 |
| | | | | 341/145 |
| 9,520,890 | B1 * | 12/2016 | Ben-Bassat | H03M 1/1014 |
| 9,685,969 | B1 * | 6/2017 | Garg | H03M 1/66 |
| 10,298,249 | B1 * | 5/2019 | Khoshgard | H03M 1/1215 |
| 10,516,406 | B1 * | 12/2019 | Kuttner | H03M 1/0845 |
| 10,530,379 | B1 * | 1/2020 | Vaz | H03M 1/1004 |
| 10,581,442 | B2 * | 3/2020 | Kauffman | H03M 1/1004 |
| 10,686,427 | B1 * | 6/2020 | Gambhir | G11B 20/10037 |
| 11,184,018 | B1 * | 11/2021 | Liu | H03K 5/1565 |

(Continued)

FOREIGN PATENT DOCUMENTS

DE      102022133895      6/2023

OTHER PUBLICATIONS

Kim, Jihwan, "A 112 Gbs PAM4 56 Gbs NRZ Reconfigurable Transmitter With Three Tap FFE in 10nm FinFET", IEEE Journal of Solid State Circuits vol. 54 No. 1, (Jan. 2019), 14 pgs.

(Continued)

*Primary Examiner* — Lam T Mai
(74) *Attorney, Agent, or Firm* — Schwegman Lundberg & Woessner, P.A.

(57) ABSTRACT

An apparatus can include a digital-to-analog converter (DAC) and calibration circuitry including an oscillator. The calibration circuitry can be coupled to an output of the DAC, the calibration circuitry to sample and count DAC output pulses for at least two consecutive pulses using at least two separate counter circuits. The calibration circuitry can determine error between at least two consecutive pulses and provide a correction value based on the error. The apparatus can further include correction circuitry to provide a calibration signal to the DAC based on the correction value.

20 Claims, 23 Drawing Sheets

(56) References Cited

U.S. PATENT DOCUMENTS

| | | | |
|---|---|---|---|
| 11,228,478 B1* | 1/2022 | Neofytou | H04L 27/0014 |
| 11,539,371 B1* | 12/2022 | Tang | H03M 1/1014 |
| 2009/0237285 A1* | 9/2009 | Schemmann | H03M 1/0614 |
| | | | 341/144 |
| 2010/0008459 A1* | 1/2010 | Eldredge | H04L 7/033 |
| | | | 375/371 |
| 2013/0234871 A1* | 9/2013 | Eliezer | H03M 1/1009 |
| | | | 341/120 |
| 2016/0308545 A1* | 10/2016 | Chandra | H03M 1/066 |
| 2016/0365933 A1* | 12/2016 | Jiang | H04B 17/00 |
| 2018/0287624 A1* | 10/2018 | Chandra | H03M 1/0624 |
| 2018/0294818 A1* | 10/2018 | Galambos | H03M 1/1245 |
| 2019/0296756 A1* | 9/2019 | Ali | H03F 3/45237 |
| 2022/0224349 A1* | 7/2022 | Varshney | H03M 1/50 |
| 2023/0097708 A1* | 3/2023 | Mahmoudidaryan | H03M 1/661 |
| | | | 341/144 |
| 2023/0318801 A1* | 10/2023 | Banin | H04L 7/0016 |
| | | | 375/362 |
| 2024/0187013 A1* | 6/2024 | Varshney | H03M 1/50 |

OTHER PUBLICATIONS

Menolfi, Christian, "A 112Gbs 2.6pJb 8tap FFE PAM4 SST TX in 14nm CMOS", 2018 IEEE International Solid-State Circuits Conference—(ISSCC). IEEE, 2018., (Feb. 2018), 3 pages.

* cited by examiner

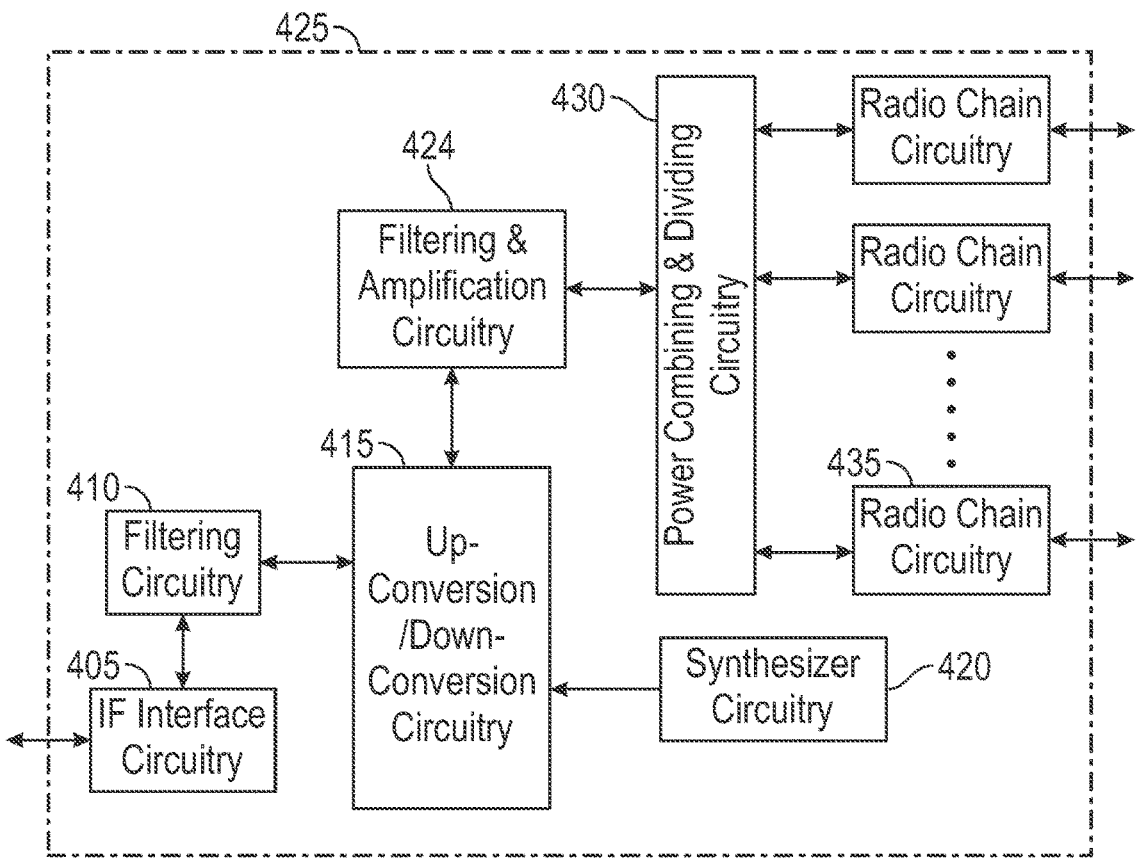
FIG. 4
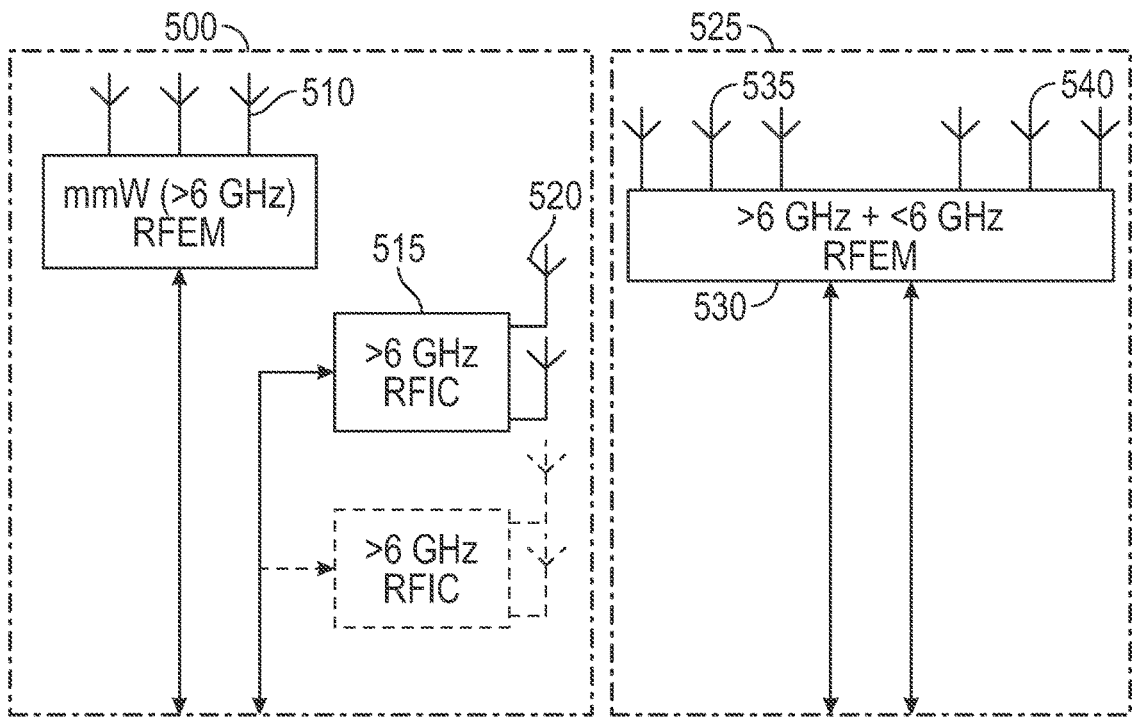
FIG. 5A
FIG. 5B

HIGH-SPEED DIGITAL-TO-ANALOG CONVERTER CALIBRATION

TECHNICAL FIELD

Aspects of the disclosure pertain to radio frequency (RF) communications. More particularly, aspects relate to digital-to-analog converters (DACs) for RF communications.

BACKGROUND

High speed digital-to-analog converters (DACs) rely on multiple clock phases and multiplexers to increase data rate. However, mismatch in the multi-phase clock generation and distribution as well as the multiplexer in the output stage can generate timing skew and duty-cycle distortion in the clock phases, severely degrading DAC performance. Accordingly, there is a general need to increase accuracy and reduce distortion in high speed DACs.

BRIEF DESCRIPTION OF THE DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which:

FIG. 4 illustrates exemplary useable RF circuitry in FIG. 3A according to some aspects.

FIG. 5A illustrates an aspect of an exemplary radio front end module (RFEM) according to some aspects.

FIG. 5B illustrates an alternate aspect of an exemplary radio front end module, according to some aspects.

DETAILED DESCRIPTION

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

High speed (on the order of tens of 10s of gigasamples (GS) per second) digital-to-analog converters (DACs) rely on multiple clock phases and multiplexers to multiply the data-rate by the number of clock phases. Multiplexing is needed to implement high-speed DACs because 20+ GHz clocks are difficult and power hungry to route on chip. Higher multiplexing factors are desired to further reduce on-chip clock distribution power and achieve higher DAC data rates. However, mismatch in the multi-phase clock generation and distribution as well as the multiplexer in the output stage can generate timing skew and duty-cycle distortion in the clock phases, severely degrading DAC performance. Therefore, accurate calibration of the timing skew and duty-cycle play an important role in improving the DAC performance and therefore the error vector magnitude (EVM) of the entire system.

Previous solutions correct the timing error at the input of the DAC before routing to output multiplexers. However, available systems do not correct and detect errors at the output, and substantial error can be introduced in the multiplexers at the output, including mismatch in the multiplexers and clock routing (e.g., due to coupling imbalance).

Aspects of the disclosure address these and other concerns by providing a timing calibration technique that observes the mismatches at the output of the DAC to allow the entire path to be corrected, making the layout less sensitive to the matching. Moreover, the calibration logic corrects each clock phase independently to make the DAC pulses have equal widths. Calibration can be provided in both background and foreground using the same logic but with difference in implementation. The communication systems, devices, and other components in which DAC calibration and error correction is conducted are described in more detail with respect to FIG. 1-9.

Figure 1:
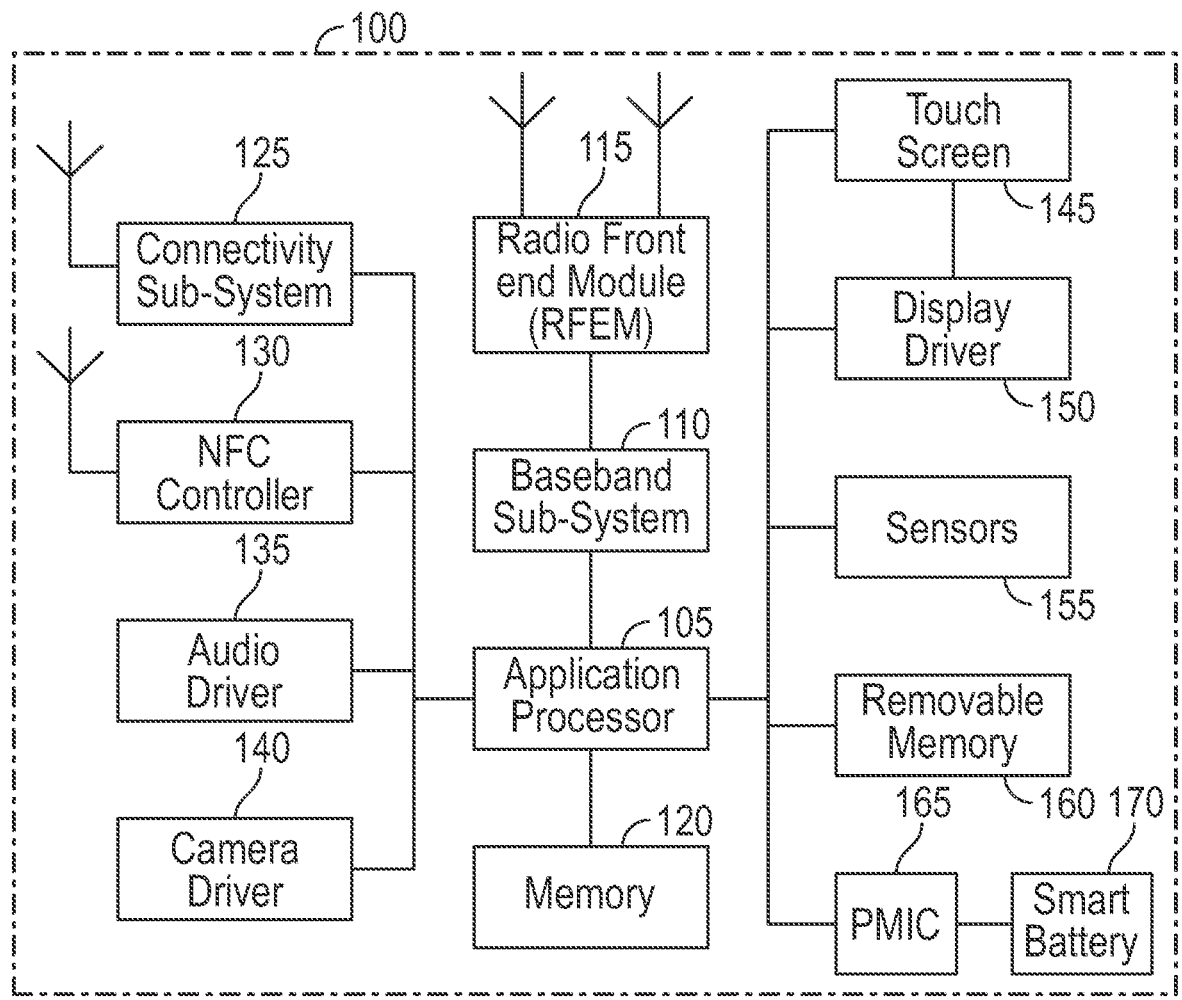
FIG. 1 illustrates an exemplary user device according to some aspects.

An integrated Radio-Frequency frontend module (FEM) is broadly used in the frontend circuits for cellular handsets or other wireless devices. FIG. 1 illustrates an exemplary user device according to some aspects. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as serial peripheral interface (SPI), inter-integrated circuit (I2C) or universal programmable serial interface sub-system, real time clock (RTC), timer-counters including interval and watchdog timers, general purpose IO, memory card controllers such as SD/MMC or similar, USB interfaces, mobile industry processor interface (MIPI) interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband processor 110 and RFEM 115 in a mmWave system is shown in FIG. 1A.

Figure 1A:
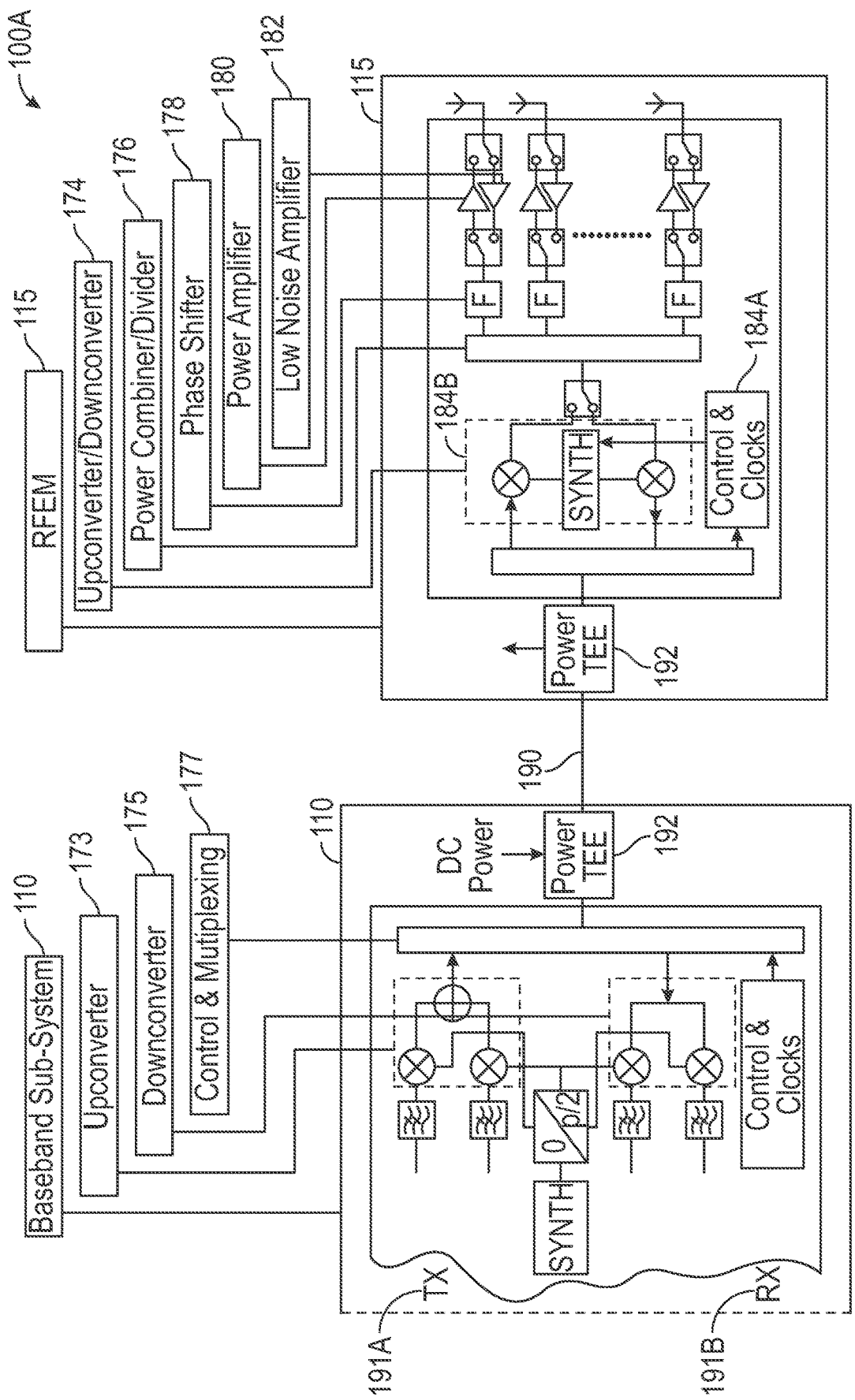
FIG. 1A illustrates a mmWave system, which can be used in connection with the device of FIG. 1 according to some aspects.

FIG. 1A illustrates a mmWave system 100A, which can be used in connection with the device 100 of FIG. 1 according to some aspects of the present disclosure. The system 100A includes two components: a baseband processor 110 and one or more radio front end modules (RFEMs) 115. The RFEM 115 can be connected to the baseband processor 110 by a single coaxial cable 190, which supplies a modulated intermediate frequency (IF) signal, DC power, clocking signals and control signals.

The baseband processor 110 is not shown in its entirety, but FIG. 1A rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion/downconversion 174 so that the IF signals over the coaxial cable 190 can be at a lower frequency. Additional system context for mmWave 5G apparatuses, techniques and features is discussed herein below.

Figure 2:
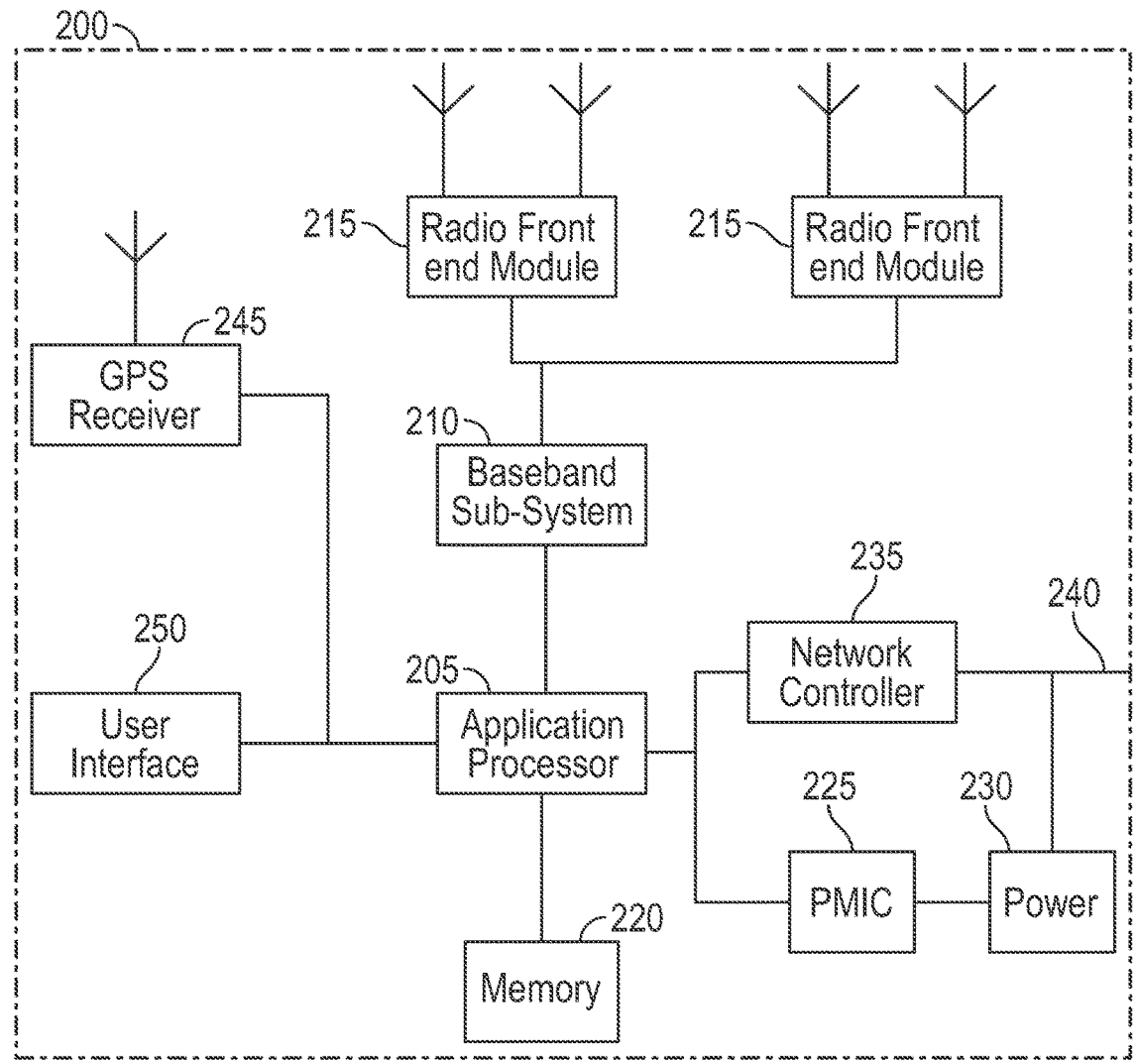
FIG. 2 illustrates an exemplary base station radio head according to some aspects.

FIG. 2 illustrates an exemplary base station or infrastructure equipment radio head according to some aspects. The base station radio head 200 may include one or more of application processor 205, baseband processors 210, one or more radio front end modules 215, memory 220, power management integrated circuitry (PMIC) 225, power tee circuitry 230, network controller 235, network interface connector 240, satellite navigation receiver (e.g., GPS receiver) 245, and user interface 250.

In some aspects, application processor 205 may include one or more CPU cores and one or more of cache memory, low drop-out voltage regulators (LDOs), interrupt controllers, serial interfaces such as SPI, I2C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip sub-system including two or more integrated circuits.

In some aspects, memory 220 may include one or more of volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable. Power tee circuitry 230 may provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide, to application processor 205, data which may include one or more of position data or time data. Time data may be used by application processor 205 to synchronize operations with other radio base stations or infrastructure equipment.

In some aspects, user interface 250 may include one or more of buttons. The buttons may include a reset button. User interface 250 may also include one or more indicators such as LEDs and a display screen.

Figure 3A:
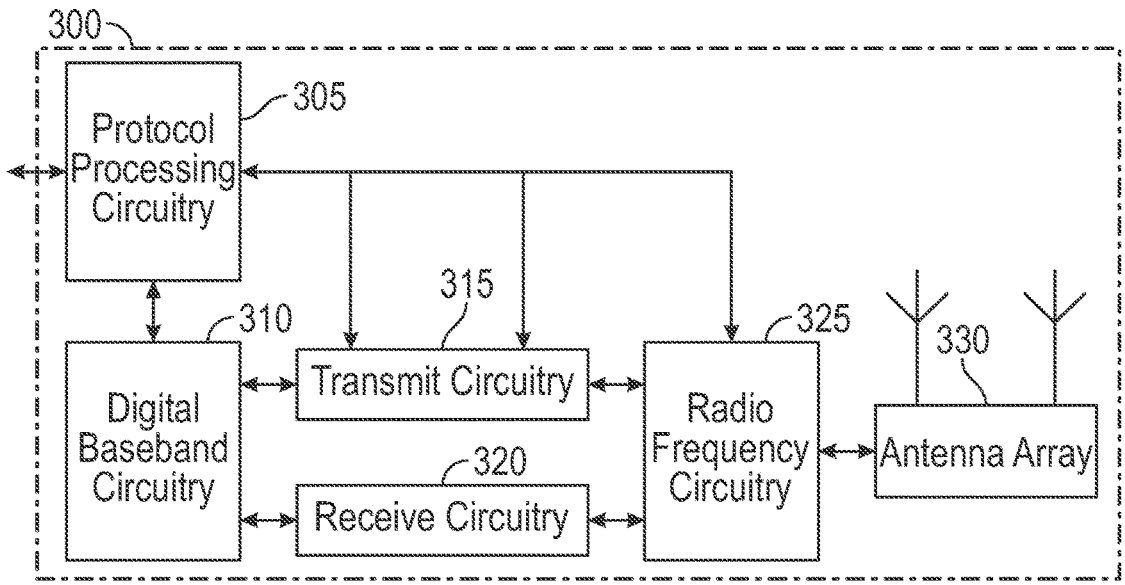
FIG. 3A illustrates exemplary wireless communication circuitry according to some aspects.
Figure 3B:
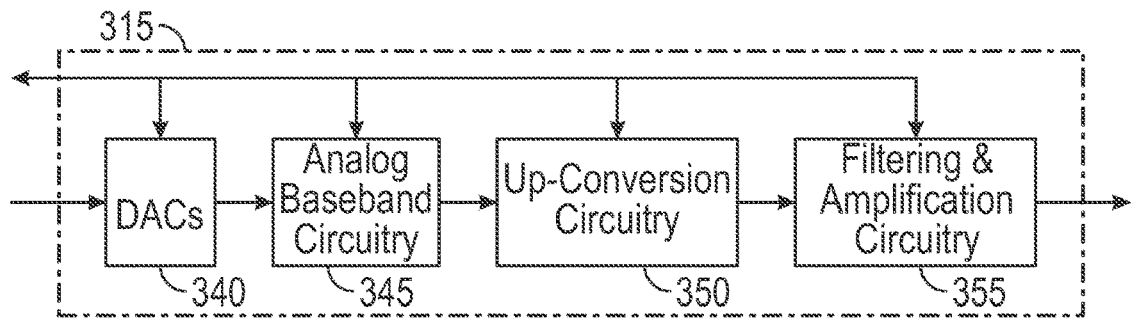
FIG. 3B illustrates aspects of exemplary transmit circuitry illustrated in FIG. 3A according to some aspects.
Figure 3C:
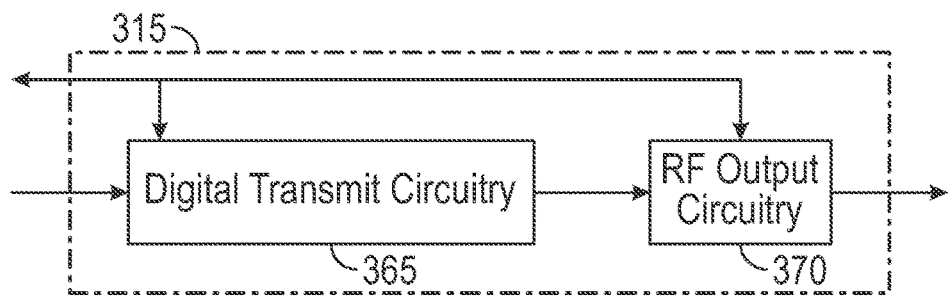
FIG. 3C illustrates aspects of exemplary transmit circuitry illustrated in FIG. 3A according to some aspects.
Figure 3D:
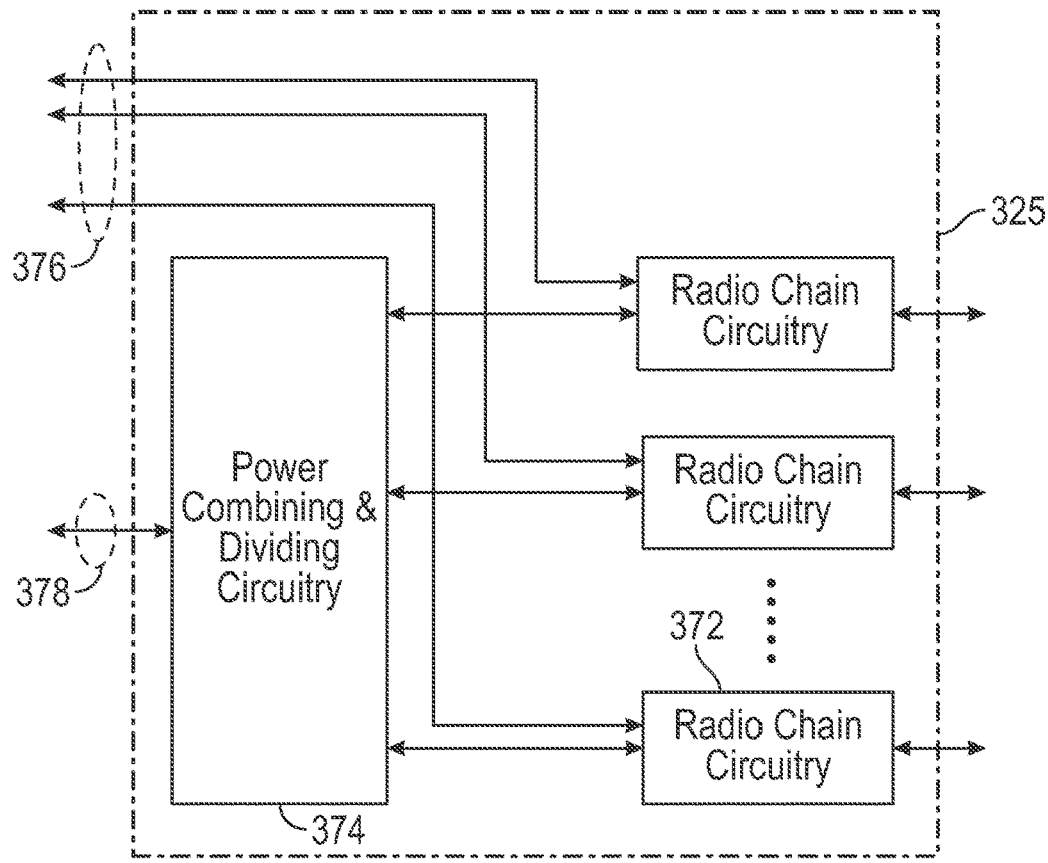
FIG. 3D illustrates aspects of exemplary radio frequency circuitry illustrated in FIG. 3A according to some aspects.
Figure 3E:
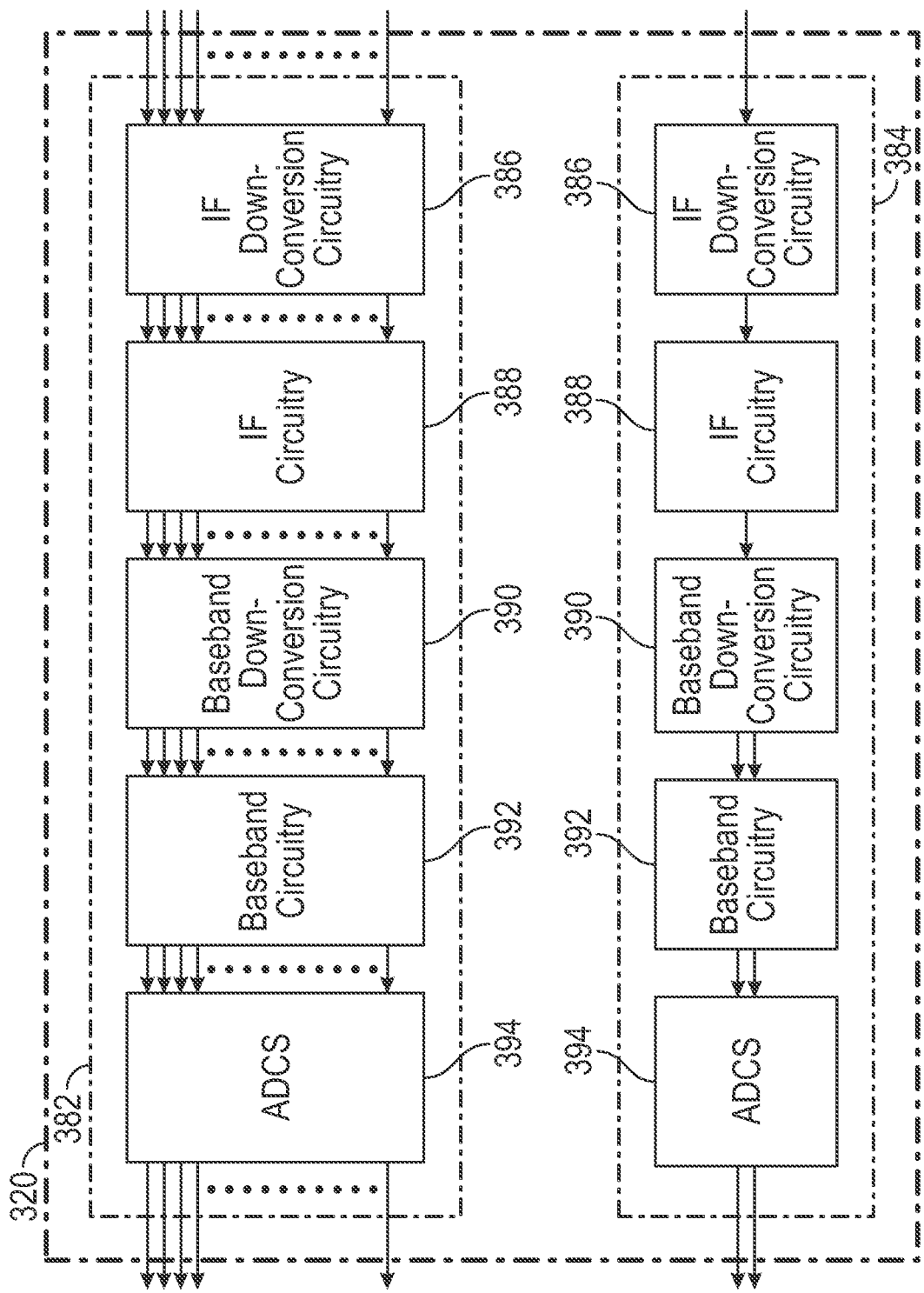
FIG. 3E illustrates aspects of exemplary receive circuitry in FIG. 3A according to some aspects.

FIG. 3A illustrates exemplary wireless communication circuitry according to some aspects; FIGS. 3B and 3C illustrate aspects of transmit circuitry shown in FIG. 3A according to some aspects; FIG. 3D illustrates aspects of radio frequency circuitry shown in FIG. 3A according to some aspects; FIG. 3E illustrates aspects of receive circuitry in FIG. 3A according to some aspects. Wireless communication circuitry 300 shown in FIG. 3A may be alternatively grouped according to functions. Components illustrated in FIG. 3A are provided here for illustrative purposes and may include other components not shown in FIG. 3A.

Wireless communication circuitry 300 may include protocol processing circuitry 305 (or processor) or other means for processing. Protocol processing circuitry 305 may implement one or more of medium access control (MAC), radio link control (RLC), packet data convergence protocol (PDCP), radio resource control (RRC) and non-access stratum (NAS) functions, among others. Protocol processing circuitry 305 may include one or more processing cores to execute instructions and one or more memory structures to store program and data information.

Wireless communication circuitry 300 may further include digital baseband circuitry 310. Digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Wireless communication circuitry 300 may further include transmit circuitry 315, receive circuitry 320 and/or antenna array circuitry 330. Wireless communication circuitry 300 may further include RF circuitry 325. In some aspects, RF circuitry 325 may include one or multiple parallel RF chains for transmission and/or reception. Each of the RF chains may be connected to one or more antennas of antenna array circuitry 330.

In some aspects, protocol processing circuitry 305 may include one or more instances of control circuitry. The control circuitry may provide control functions for one or more of digital baseband circuitry 310, transmit circuitry 315, receive circuitry 320, and/or RF circuitry 325.

FIGS. 3B and 3C illustrate aspects of transmit circuitry shown in FIG. 3A according to some aspects. Transmit circuitry 315 shown in FIG. 3B may include one or more of digital to analog converters (DACs) 340, analog baseband circuitry 345, up-conversion circuitry 350 and/or filtering and amplification circuitry 355. DACs 340 may convert digital signals into analog signals. Analog baseband circuitry 345 may perform multiple functions as indicated below. Up-conversion circuitry 350 may up-convert baseband signals from analog baseband circuitry 345 to RF frequencies (e.g., mmWave frequencies). Filtering and amplification circuitry 355 may filter and amplify analog signals. Control signals may be supplied between protocol processing circuitry 305 and one or more of DACs 340, analog baseband circuitry 345, up-conversion circuitry 350 and/or filtering and amplification circuitry 355.

Transmit circuitry 315 shown in FIG. 3C may include digital transmit circuitry 365 and RF circuitry 370. In some aspects, signals from filtering and amplification circuitry 355 may be provided to digital transmit circuitry 365. As above, control signals may be supplied between protocol processing circuitry 305 and one or more of digital transmit circuitry 365 and RE circuitry 370.

FIG. 3D illustrates aspects of radio frequency circuitry shown in FIG. 3A according to some aspects. Radio frequency circuitry 325 may include one or more instances of radio chain circuitry 372, which in some aspects may include one or more filters, power amplifiers, low noise amplifiers, programmable phase shifters and power supplies.

Radio frequency circuitry 325 may also in some aspects include power combining and dividing circuitry 374. In some aspects, power combining and dividing circuitry 374 may operate bidirectionally, such that the same physical circuitry may be configured to operate as a power divider when the device is transmitting, and as a power combiner when the device is receiving. In some aspects, power combining and dividing circuitry 374 may include one or more wholly or partially separate circuitries to perform power dividing when the device is transmitting and power combining when the device is receiving. In some aspects, power combining and dividing circuitry 374 may include passive circuitry including one or more two-way power divider/combiners arranged in a tree. In some aspects, power combining and dividing circuitry 374 may include active circuitry including amplifier circuits.

In some aspects, radio frequency circuitry 325 may connect to transmit circuitry 315 and receive circuitry 320 in FIG. 3A. Radio frequency circuitry 325 may connect to transmit circuitry 315 and receive circuitry 320 via one or more radio chain interfaces 376 and/or a combined radio chain interface 378. In some aspects, one or more radio chain interfaces 376 may provide one or more interfaces to one or more receive or transmit signals, each associated with a single antenna structure. In some aspects, the combined radio chain interface 378 may provide a single interface to one or more receive or transmit signals, each associated with a group of antenna structures.

FIG. 3E illustrates aspects of receive circuity in FIG. 3A according to some aspects. Receive circuitry 320 may include one or more of parallel receive circuitry 382 and/or one or more of combined receive circuitry 384. In some aspects, the one or more parallel receive circuitry 382 and one or more combined receive circuitry 384 may include one or more Intermediate Frequency (IF) down-conversion circuitry 386, IF processing circuitry 388, baseband down-conversion circuitry 390, baseband processing circuitry 392 and analog-to-digital converter (ADC) circuitry 394. As used herein, the term "intermediate frequency" refers to a frequency to which a carrier frequency (or a frequency signal) is shifted as in intermediate step in transmission, reception, and/or signal processing. IF down-conversion circuitry 386 may convert received RF signals to IF. IF processing circuitry 388 may process the IF signals, e.g., via filtering and amplification. Baseband down-conversion circuitry 390 may convert the signals from IF processing circuitry 388 to baseband. Baseband processing circuitry 392 may process the baseband signals, e.g., via filtering and amplification. ADC circuitry 394 may convert the processed analog baseband signals to digital signals.

FIG. 4 illustrates exemplary RF circuitry of FIG. 3A according to some aspects. In an aspect, RF circuitry 325 in FIG. 3A (depicted in FIG. 4 using reference number 425) may include one or more of the IF interface circuitry 405, filtering circuitry 410, up-conversion and down-conversion circuitry 415, synthesizer circuitry 420, filtering and amplification circuitry 424, power combining and dividing circuitry 430, and radio chain circuitry 435.

FIG. 5A and FIG. 5B illustrate aspects of a radio front-end module (RFEM) useable in the circuitry shown in FIG. 1 and FIG. 2, according to some aspects. FIG. 5A illustrates an aspect of a RFEM according to some aspects. RFEM 500 incorporates a millimeter wave RFEM 505 and one or more above-six gigahertz radio frequency integrated circuits (RFIC) 515 and/or one or more sub-six gigahertz RFICs 522. In this aspect, the one or more sub-six gigahertz RFICs 515 and/or one or more sub-six gigahertz RFICs 522 may be physically separated from millimeter wave RFEM 505, RFICs 515 and 522 may include connection to one or more antennas 520. RFEM 505 may include multiple antennas 510.

FIG. 5B illustrates an alternate aspect of a radio front end module, according to some aspects. In this aspect both millimeter wave and sub-six gigahertz radio functions may be implemented in the same physical radio front end module (RFEM) 530. RFEM 530 may incorporate both millimeter wave antennas 535 and sub-six gigahertz antennas 540.

Figure 6:
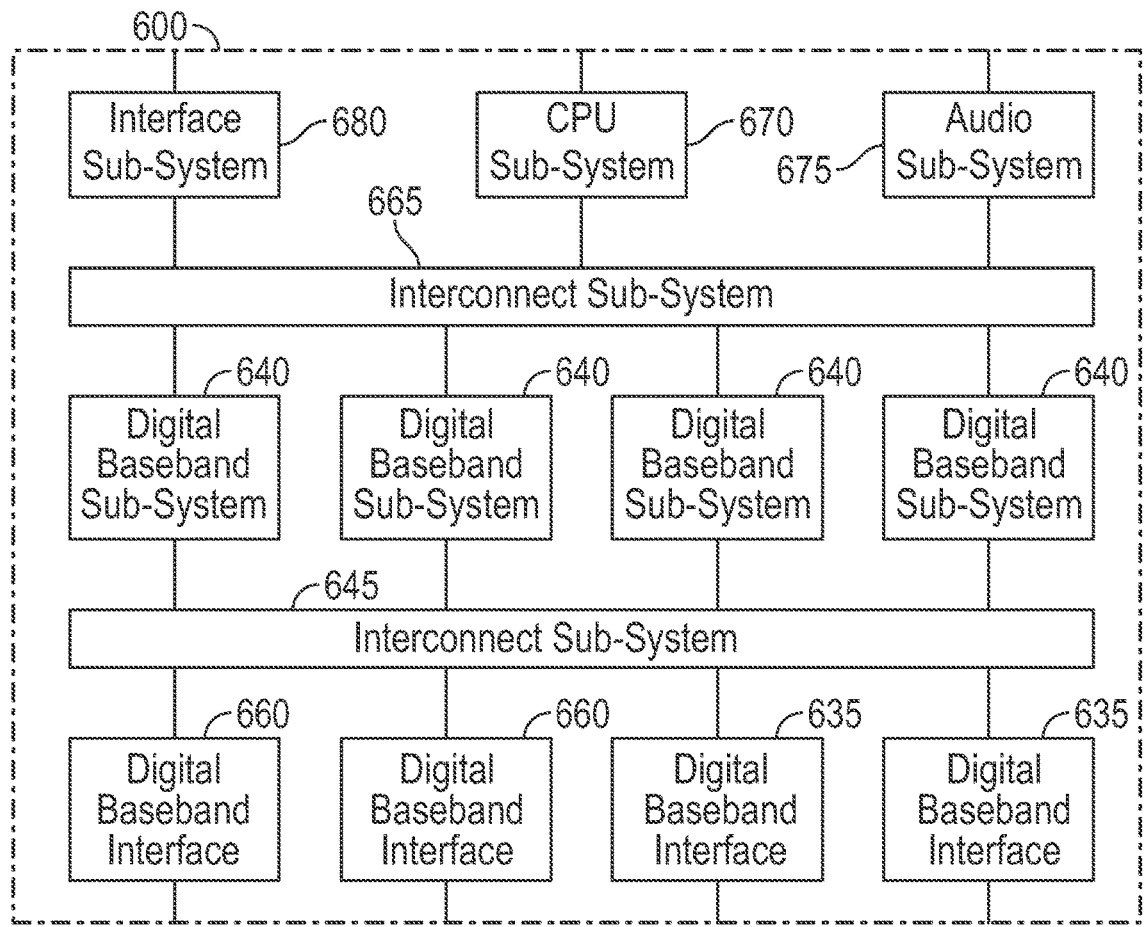
FIG. 6 illustrates an exemplary multi-protocol baseband processor useable in FIG. 1 or FIG. 2, according to some aspects.

FIG. 6 illustrates a multi-protocol baseband processor 600 useable in the system and circuitry shown in FIG. 1 or FIG. 2, according to some aspects. In an aspect, baseband processor may contain one or more digital baseband subsystems 640A, 640B, 640C, 640D, also herein referred to collectively as digital baseband subsystems 640.

In an aspect, the one or more digital baseband subsystems 640A, 640B, 640C, 640D may be coupled via interconnect subsystem 665 to one or more of CPU subsystem 670, audio subsystem 675 and interface subsystem 680. In an aspect, the one or more digital baseband subsystems 640 may be coupled via interconnect subsystem 645 to one or more of each of digital baseband interface 660A, 660B and mixed-signal baseband subsystem 635A, 635B.

In an aspect, interconnect subsystem 665 and 645 may each include one or more of each of buses point-to-point connections and network-on-chip (NOC) structures. In an aspect, audio subsystem 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Figure 7:
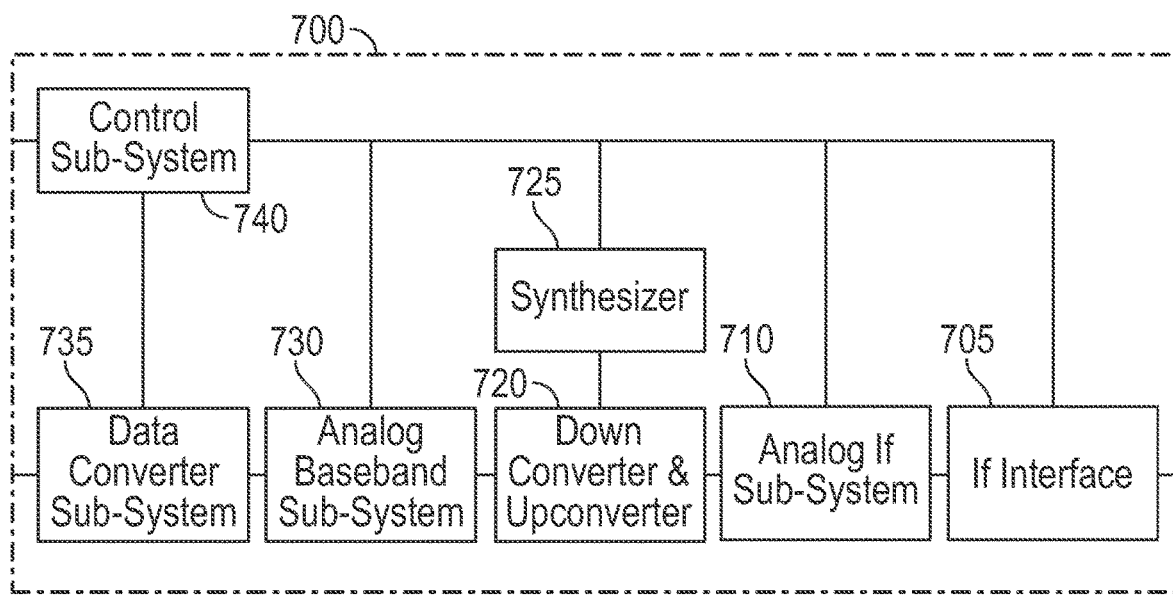
FIG. 7 illustrates an exemplary mixed signal baseband subsystem, according to some aspects.

FIG. 7 illustrates an exemplary of a mixed signal baseband subsystem 700, according to some aspects. In an aspect, mixed signal baseband subsystem 700 may include one or more of IF interface 705, analog IF subsystem 710, down-converter and up-converter subsystem 720, analog baseband subsystem 730, data converter subsystem 735, synthesizer 725 and control subsystem 740.

Figure 8A:
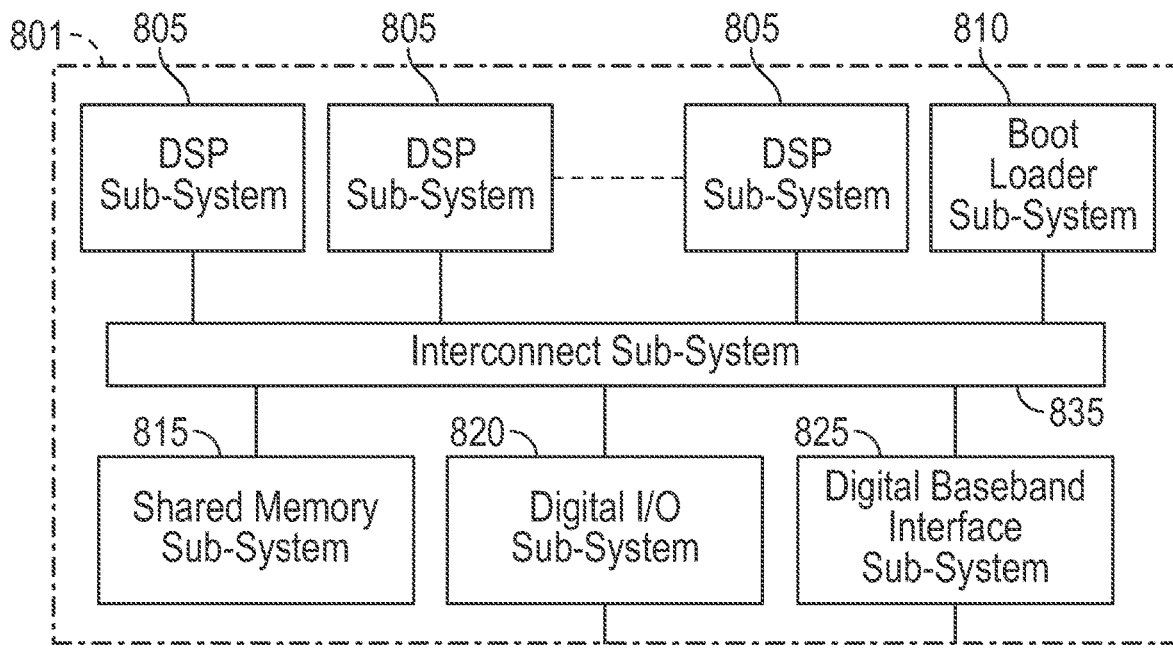
FIG. 8A illustrates an exemplary digital baseband subsystem, according to some aspects.
Figure 8B:
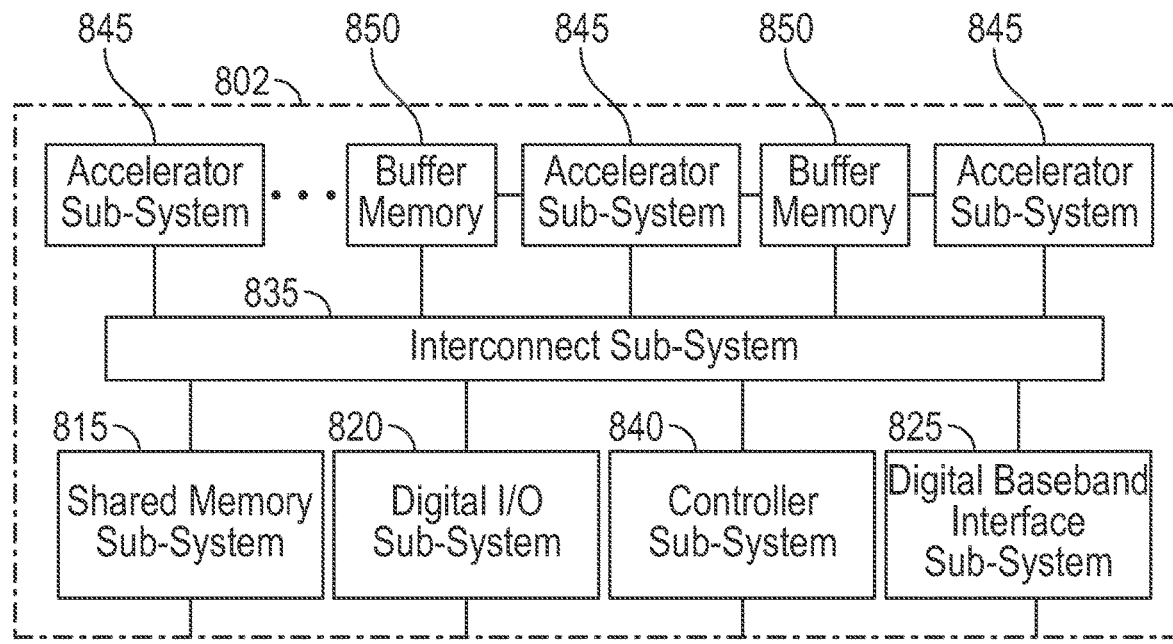
FIG. 8B illustrates an alternate aspect of an exemplary baseband processing subsystem, according to some aspects.

FIG. 8A illustrates a digital baseband processing subsystem 801, according to some aspects. FIG. 8B illustrates an alternate aspect of a digital baseband processing subsystem 802, according to some aspects.

In an aspect of FIG. 8A, the digital baseband processing subsystem 801 may include one or more of each of digital signal processor (DSP) subsystems 805A, 805B, . . . 805N, interconnect subsystem 835, boot loader subsystem 810, shared memory subsystem 815, digital I/O subsystem 820, and digital baseband interface subsystem 825.

In an aspect of FIG. 8B, digital baseband processing subsystem 802 may include one or more of each of accelerator subsystem 845A, 845B, 845N, buffer memory 850A, 850B, . . . 850N, interconnect subsystem 835, shared memory subsystem 815, digital I/O subsystem 820, controller subsystem 840 and digital baseband interface subsystem 825.

In an aspect, boot loader subsystem 810 may include digital logic circuitry configured to perform configuration of the program memory and running state associated with each of the one or more DSP subsystems 805. Configuration of the program memory of each of the one or more DSP subsystems 805 may include loading executable program code from storage external to digital baseband processing subsystems 801 and 802. Configuration of the running state associated with each of the one or more DSP subsystems 805 may include one or more of the steps of: setting the state of at least one DSP core which may be incorporated into each of the one or more DSP subsystems 805 to a state in which it is not running, and setting the state of at least one DSP core which may be incorporated into each of the one or more DSP subsystems 805 into a state in which it begins executing program code starting from a predefined memory location.

In an aspect, shared memory subsystem 815 may include one or more of read-only memory (ROM), static random access memory (SRAM), embedded dynamic random access memory (eDRAM) and/or non-volatile random access memory (NVRAM).

In an aspect, digital I/O subsystem 820 may include one or more of serial interfaces such as Inter-Integrated Circuit (I2C), Serial Peripheral Interface (SPI) or other 1, 2 or 3-wire serial interfaces, parallel interfaces such as general-purpose input-output (GPIO), register access interfaces and direct memory access (DMA). In an aspect, a register access interface implemented in digital I/O subsystem 820 may permit a microprocessor core external to digital baseband processing subsystem 801 to read and/or write one or more of control and data registers and memory. In an aspect, DMA logic circuitry implemented in digital I/O subsystem 820 may permit transfer of contiguous blocks of data between memory locations including memory locations internal and external to digital baseband processing subsystem 801.

In an aspect, digital baseband interface subsystem 825 may provide for the transfer of digital baseband samples between baseband processing subsystem and mixed signal baseband or radio-frequency circuitry external to digital baseband processing subsystem 801. In an aspect, digital baseband samples transferred by digital baseband interface subsystem 825 may include in-phase and quadrature (I/Q) samples.

In an aspect, controller subsystem 840 may include one or more of each of control and status registers and control state machines. In an aspect, control and status registers may be accessed via a register interface and may provide for one or more of: starting and stopping operation of control state machines, resetting control state machines to a default state, configuring optional processing features, and/or configuring the generation of interrupts and reporting the status of operations. In an aspect, each of the one or more control state machines may control the sequence of operation of each of the one or more accelerator subsystems 845. There may be examples of implementations of both FIG. 8A and FIG. 8B in the same baseband subsystem.

Figure 9:
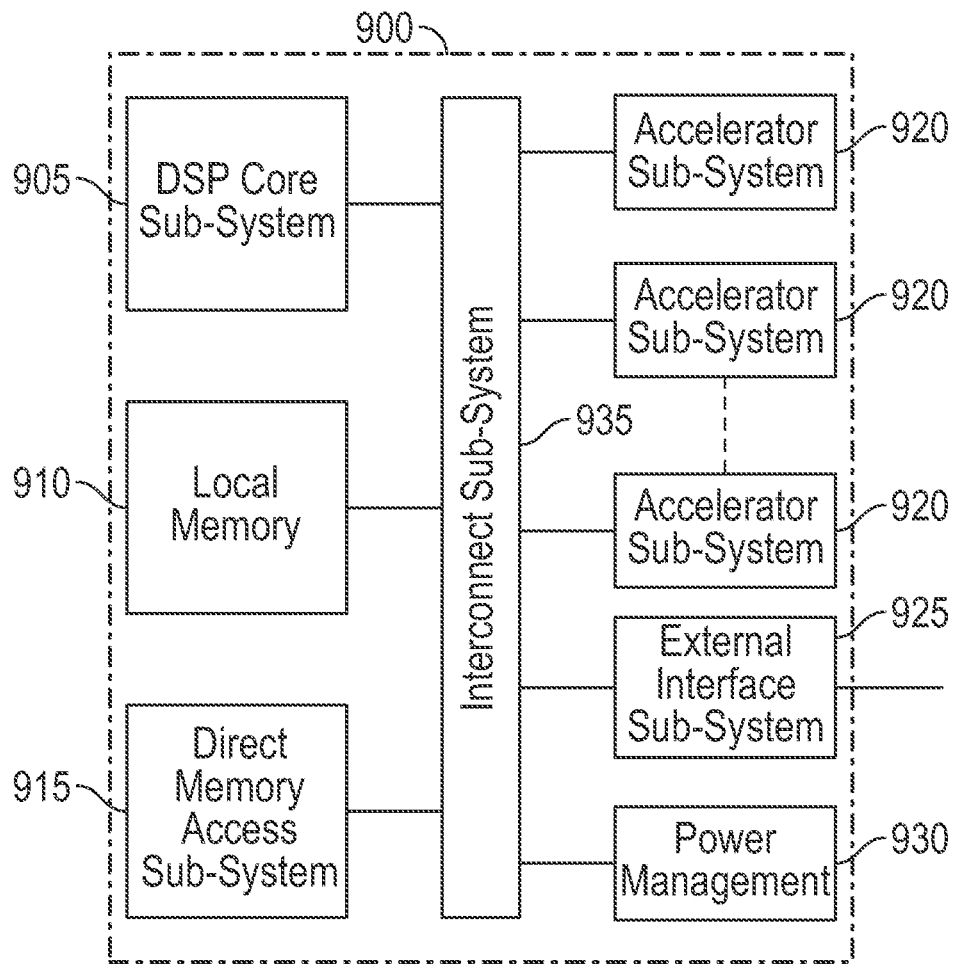
FIG. 9 illustrates an exemplary digital signal processor subsystem, according to some aspects.

FIG. 9 illustrates a digital signal processor (DSP) subsystem 900 according to some aspects. In an aspect, DSP subsystem 900 may include one or more of each of DSP core subsystem 905, local memory 910, direct memory access (DMA) subsystem 915, accelerator subsystem 920A, 920B . . . 920N, external interface subsystem 925, power management circuitry 930 and interconnect subsystem 935.

In an aspect, the local memory 910 may include one or more of each of read-only memory, static random access memory or embedded dynamic random access memory.

In an aspect, the DMA subsystem 915 may provide registers and control state machine circuitry adapted to transfer blocks of data between memory locations including memory locations internal and external to DSP subsystem 900.

In an aspect, external interface subsystem 925 may provide for access by a microprocessor system external to DSP subsystem 900 to one or more of memory, control registers and status registers which may be implemented in DSP subsystem 900. In an aspect, external interface subsystem 925 may provide for transfer of data between local memory 910 and storage external to DSP subsystem 900 under the control of one or more of the DMA subsystem 915 and the DSP core subsystem 905.

High-Speed DAC Calibration

As described earlier herein, high-speed DACs may experience mismatch in the multi-phase clock generation and distribution which can generate timing skew and duty-cycle distortion in the clock phases, severely degrading DAC performance. Previous solutions correct the timing error at the input of the DAC but do not correct and detect errors at the output. Substantial error can be introduced in the DAC itself and at the output. Aspects address these concerns by providing an accurate calibration technique by measuring the error at the output of the DAC. In addition, the pulse width comparison based calibration logic eliminates the requirement of duty-cycle correction of the clock.

Systems, methods and apparatuses according to aspects provide timing error calibration techniques for high-speed DACs according to at least one of a background method that provides continuous background calibration and a foreground calibration method that can be performed at chip start-up. Both the foreground and background methods can include similar calibration logic. Example aspects are described relative to a quadrature quarter-rate DAC using four-phase clocks, but aspects are not limited to a quadrature quarter-rate DAC using four-phase clocks. Aspects can apply for any system with one or more DACs.

Figure 10:
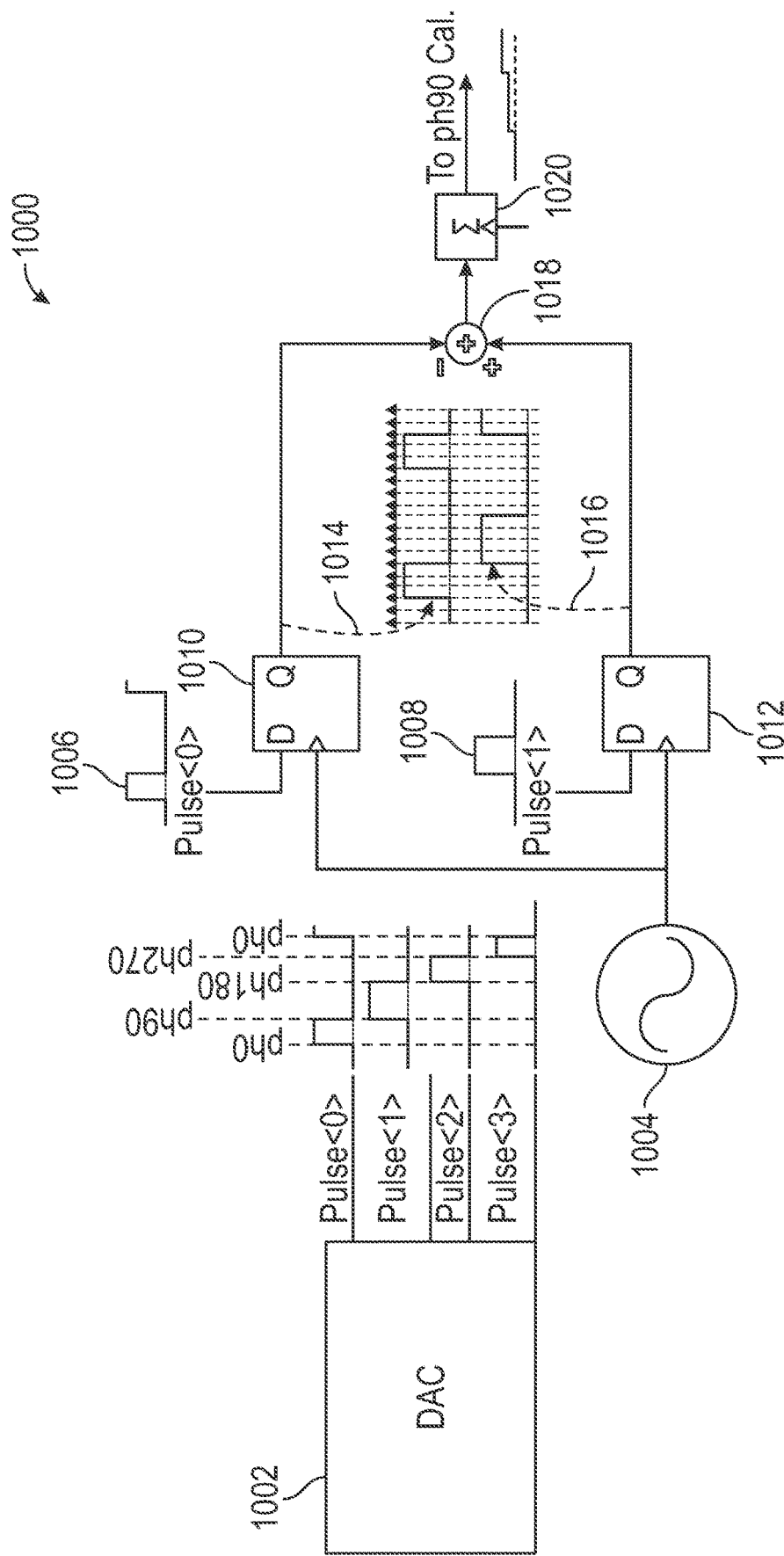
FIG. 10 illustrates an apparatus for calibrating a high-speed DAC according to some aspects.

FIG. 10 illustrates an apparatus 1000 for calibrating a high-speed DAC according to some aspects. The apparatus 1000 can comprise a digital-to-analog converter (DAC) 1002 and calibration circuitry including an oscillator (e.g., on-die with the DAC) 1004, with the calibration circuitry coupled to an output of the DAC or its replica. The oscillator 1004 can include a ring oscillator and can oscillate out of phase with clock circuitry of the DAC 1002, such that the oscillator 1004 has no frequency or phase relationship with the DAC 1002 clock to sample the DAC output pulses asynchronously.

The calibration circuitry can sample and count DAC output pulses for at least two consecutive pulses 1006, 1008 using at least two separate phase detector circuits 1010, 1012. The two separate phase detector circuits 1010, 1012 can each comprise D-flip-flop circuitry or other phase detector circuitry driving a digital accumulator.

The calibration circuitry can also determine error between at least two consecutive pulses when the outputs 1014, 1016 of separate phase detector circuits 1010, 1012 (corresponding to two consecutive pulses) are subtracted at 1018 and the error is accumulated at 1020 to correct the clock phases. The calibration circuitry can also provide a correction value based on the error. Finally, correction circuitry can provide a calibration signal to the DAC based on the correction value.

The apparatus 1000 can include circuitry to control at least one of rising edges and falling edges of DAC 1002 control clocks Ph0-270 using outputs of the two separate phase detector circuits to equalize the width of final DAC pulses shaped by Ph0-270. In the example of FIG. 10, the falling edge of Pulse<0> and the rising edge of Pulse<1> are controlled by Ph90 as described later herein with reference to FIG. 11, and the Ph90 phase is corrected to make Pulse<0> and Pulse<1> width equal. Ph180 and Ph270 are also corrected in a similar way to adjust the remaining pulses.

The calibration loop can either run in the background using a replica DAC or in foreground by applying a predefined data sequence as explained below. The calibration signal can be provided to digital-to-time converters (DTCs) for providing to the operating DACs as described in more detail later herein.

Background Calibration and Foreground Calibration

The DAC can be included in a replica DAC separate from operating DACs of a wireless device that includes the apparatus 1000. Alternatively, the DAC is an operating DAC of a wireless device that includes the apparatus. The former will be referred to as background calibration, while the latter will be referred to hereinafter as foreground calibration.

Figure 11:
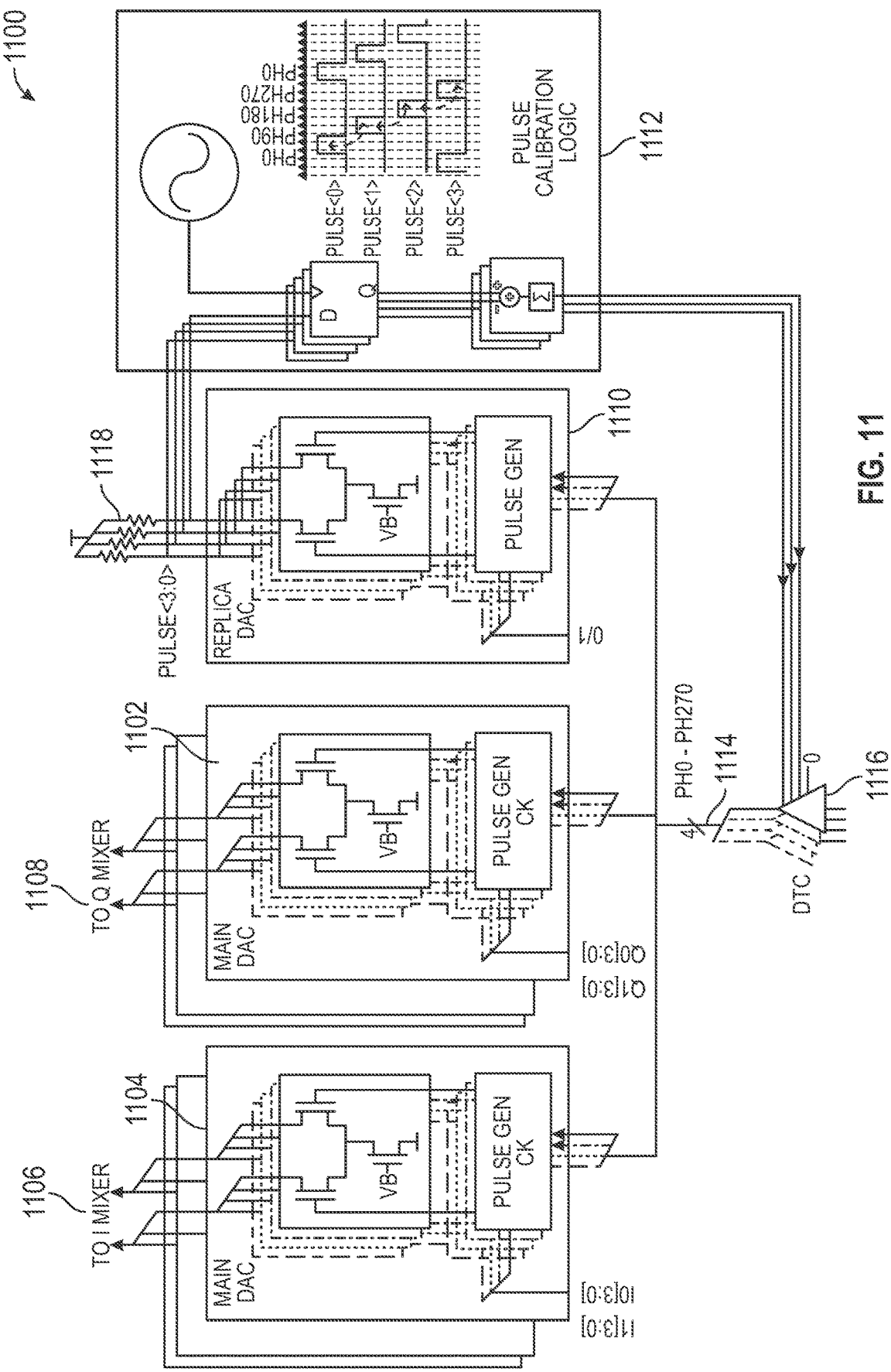
FIG. 11 illustrates a system for background DAC calibration according to some aspects.

FIG. 11 illustrates a system 1100 for background DAC calibration according to some aspects. The system 1100 can be used in transmit circuitry, for example as inputs into mixers for modulation schemes. The example shown illustrates a DAC targeted for 16-quadrature amplitude modulation (QAM), which can essentially be considered pulse amplitude modulation (PAM)-4 on both I and Q DACs. This replica technique can be used for modulators with only a single DAC as well (e.g., for PAM-4 wireline transmitters).

The system 1100 can include a Q DAC 1102 and an I DAC 1104. An mixer 1106 can be coupled to an output of the I DAC 1104 and a Q mixer 1108 can be coupled to an output of the Q DAC 1102. A replica DAC 1110 can be coupled to calibration circuitry 1112. The calibration circuitry 1112 can operate similarly to circuitry discussed above with respect to FIG. 10.

The replica DAC 1110 can use the same design and layout of the main DAC units 1102, 1104 with a minor modification in which the current outputs are not shorted. This way each current pulse can be measured independently by applying a DC signal (0 or 1) as data. Resistive elements 1118 can be provided to convert a current pulse to a detectable voltage pulse. In the example implementation, a current-domain DAC is used but most detector circuits such as flip-flops operate in the voltage domain. Accordingly, the resistive element 1118 converts the current pulse to a detectable voltage pulse. The choice of resistor size can also help amplify the pulse if needed. The calibration logic described previously with reference to FIG. 10 can be used to adjust the clock phases (Ph0-270) to keep the pulses (Pulse<3:0>) equal. Clock phases 1114 can be independently corrected using DTCs 1116, where Ph0 is used as reference and other phases are corrected with respect to Ph0. The replica DAC 1110 can operate in the background without impacting the main DAC 1102, 1104 functionality and can correct errors dynamically that arise due to voltage or temperature variation.

Figure 12:
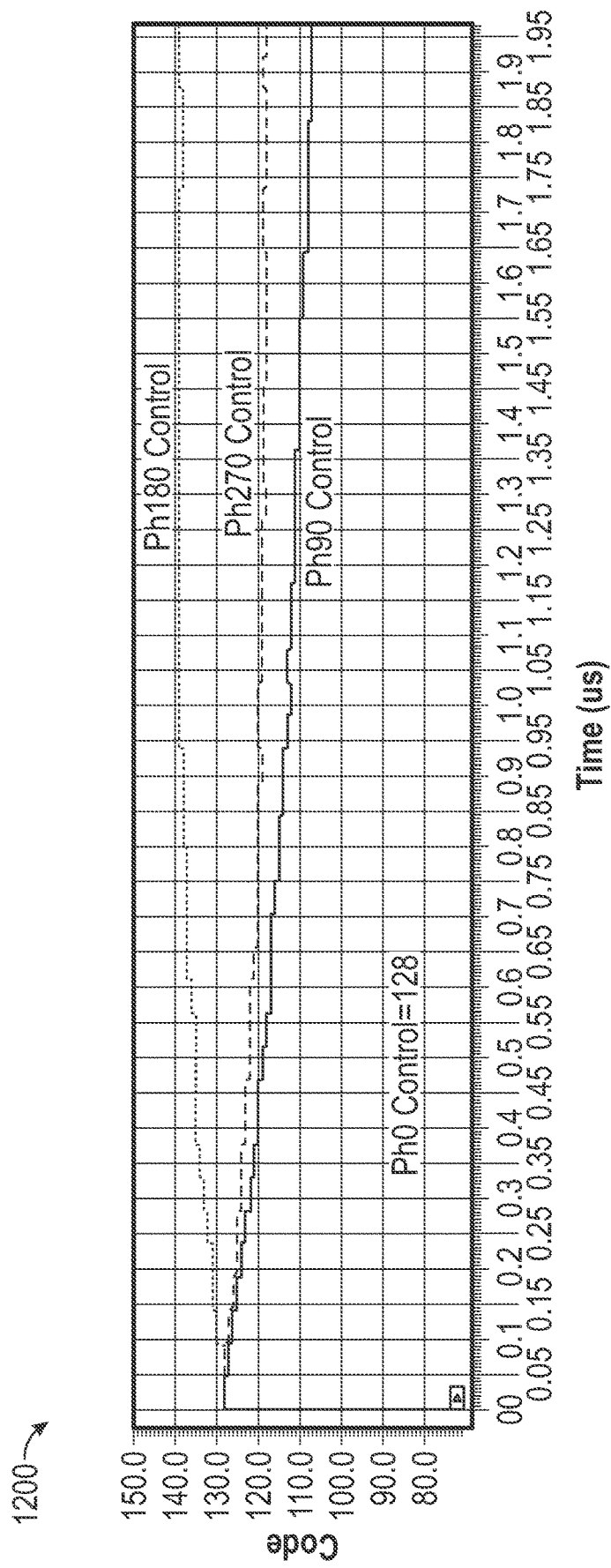
FIG. 12 illustrates transient simulation for the background loop convergence according to some aspects.
Figure 12:
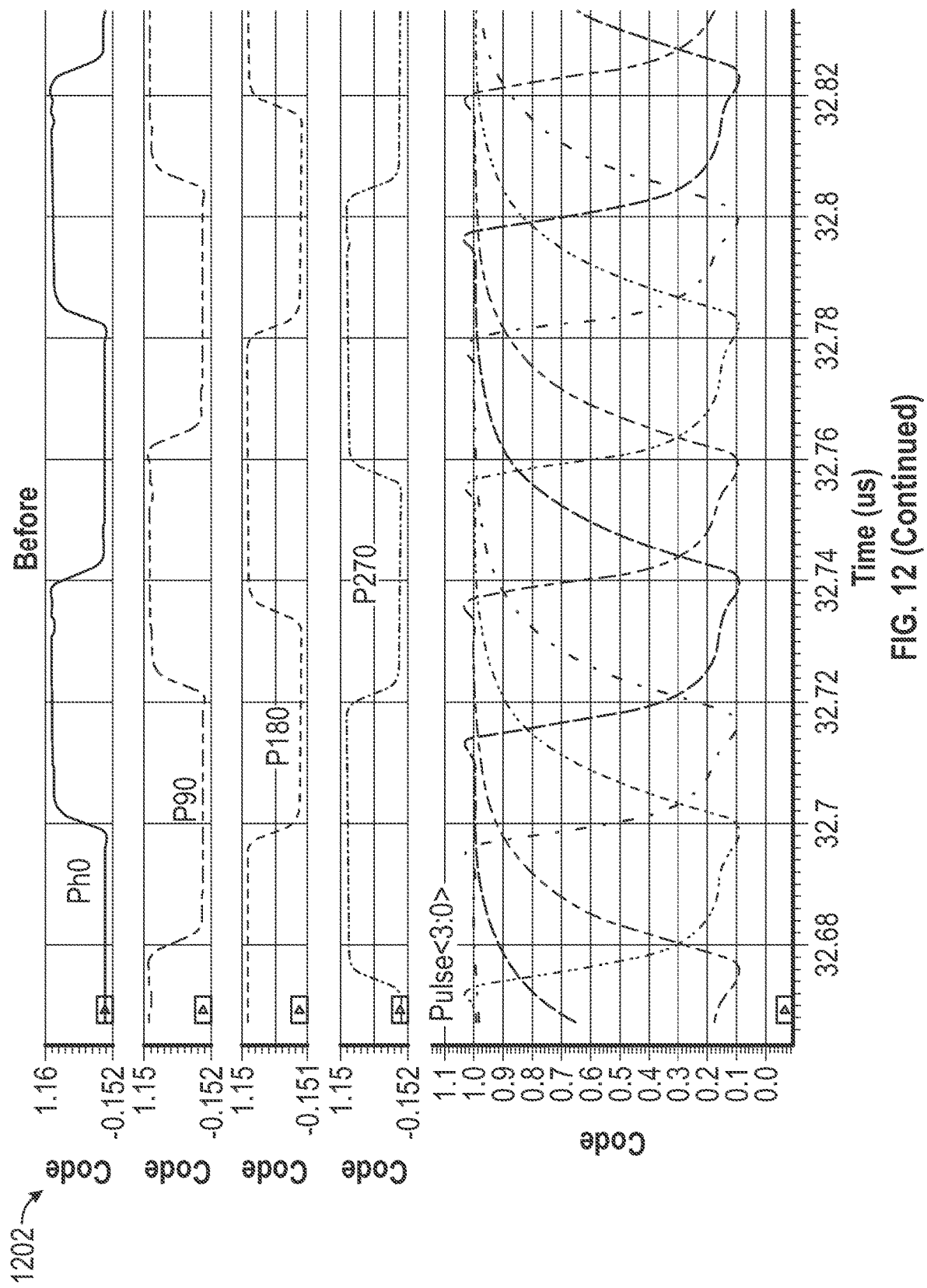
Figure 12:
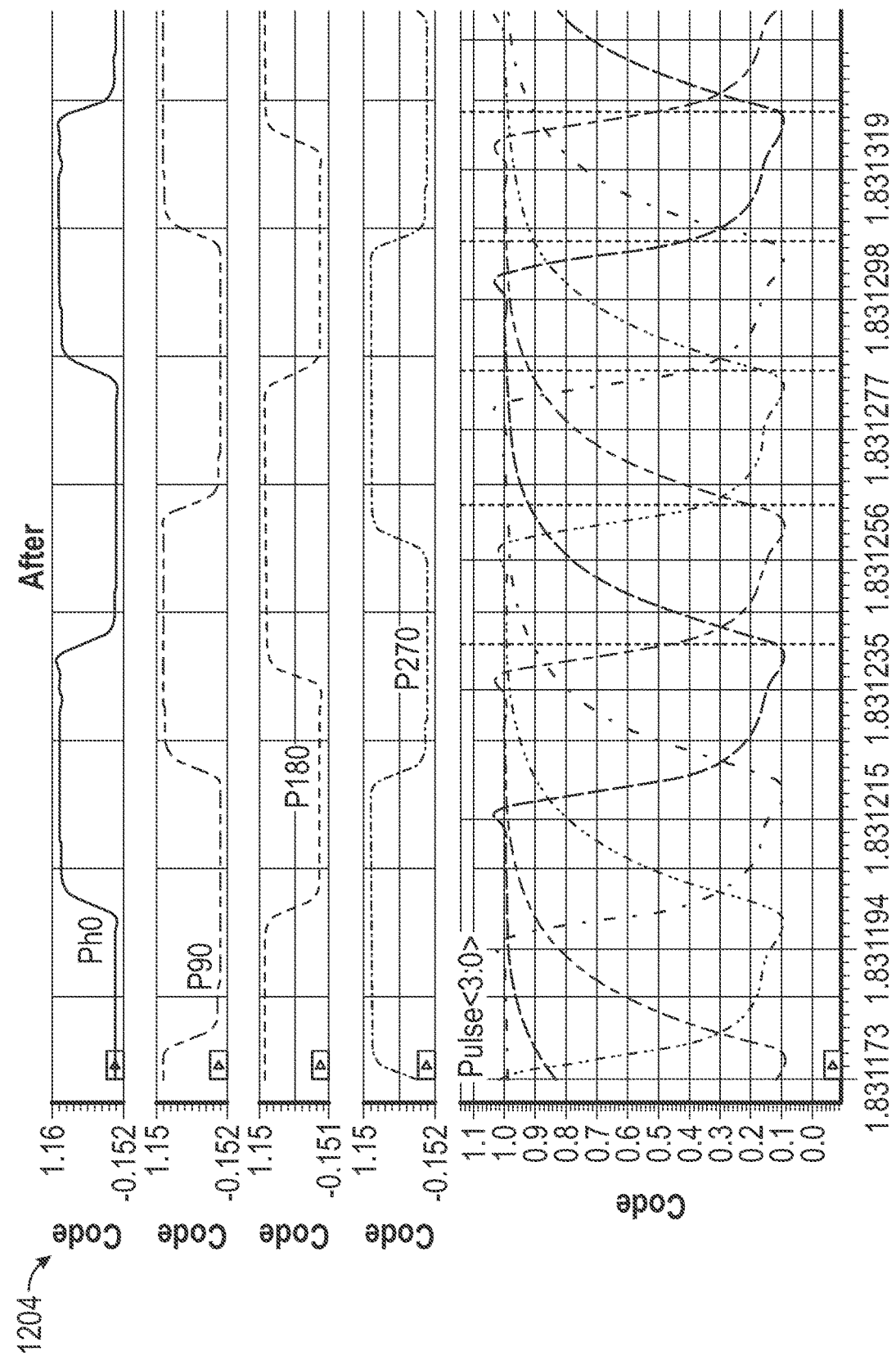

FIG. 12 illustrates transient simulation for the background loop convergence according to some aspects. Graph 1200 illustrates the time domain behavior of digital control signals configuring four input clock phases: Ph0, Ph90, Ph180, and Ph270. Calibration is performed relative to the PhD clock, so its control is constant over time. A larger rate of change in the control codes is observed when the calibration begins, and the control codes flatten out by the end of the simulation to indicate convergence. Graph 1202 shows the initial DAC input clock phases Ph0-Ph270 and corresponding DAC output pulses. The DAC output pulses are not of equal width due to initial error. Graph 1204 shows the DAC input clock phases and DAC output pulses after convergence with better matching between output pulses. The vertical markers indicate the ideal post-calibration pulse positions for reference. Only the negative edges of Ph0-Ph270 are used to generate the pulses, so they are accurately aligned after calibration. The data rate in these simulations is 46 GS/s using a 11.5 GHz quadrature clock.

Figure 13:
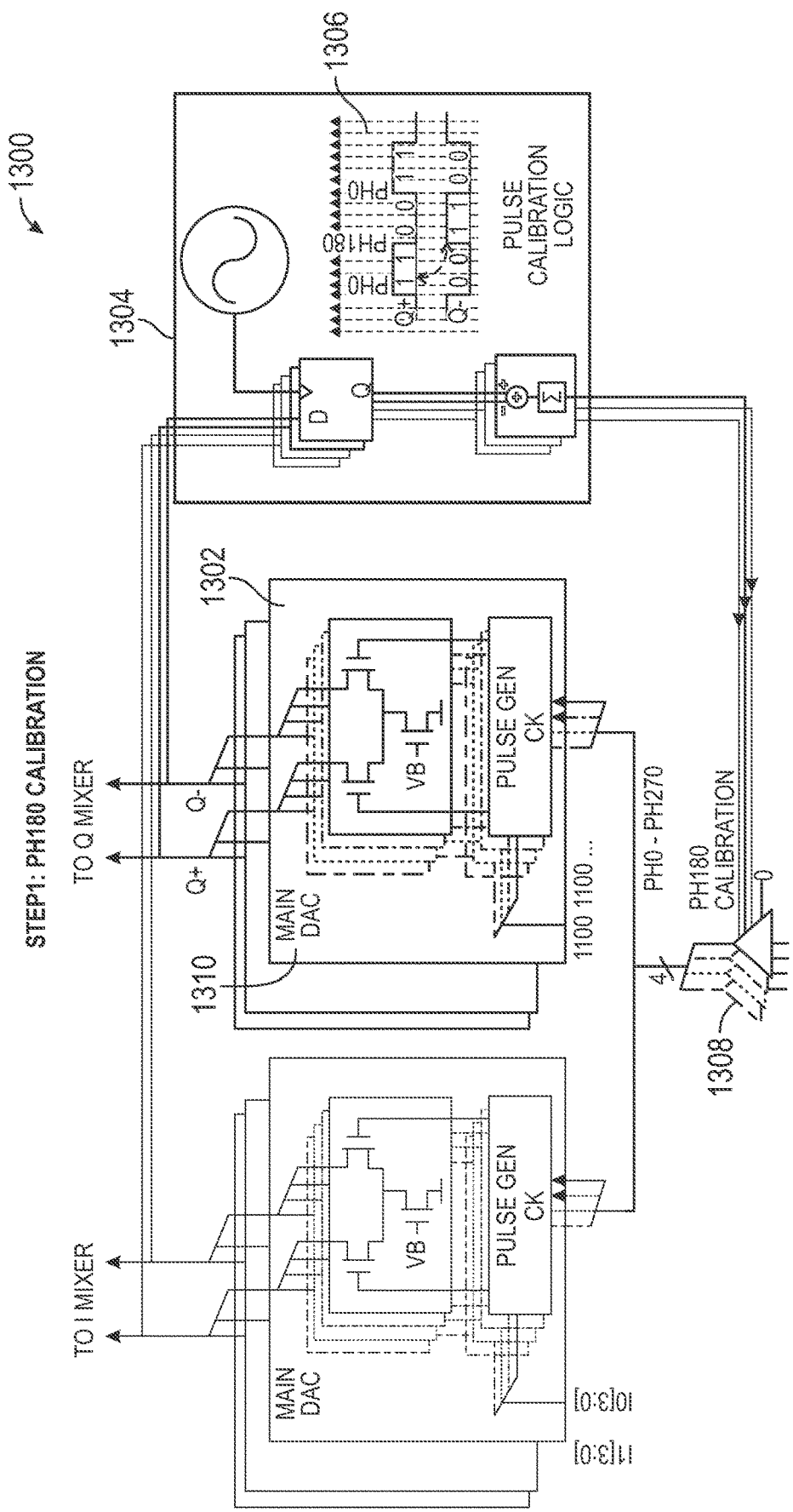
FIG. 13 illustrates a system for foreground DAC calibration according to some aspects.
Figure 13:
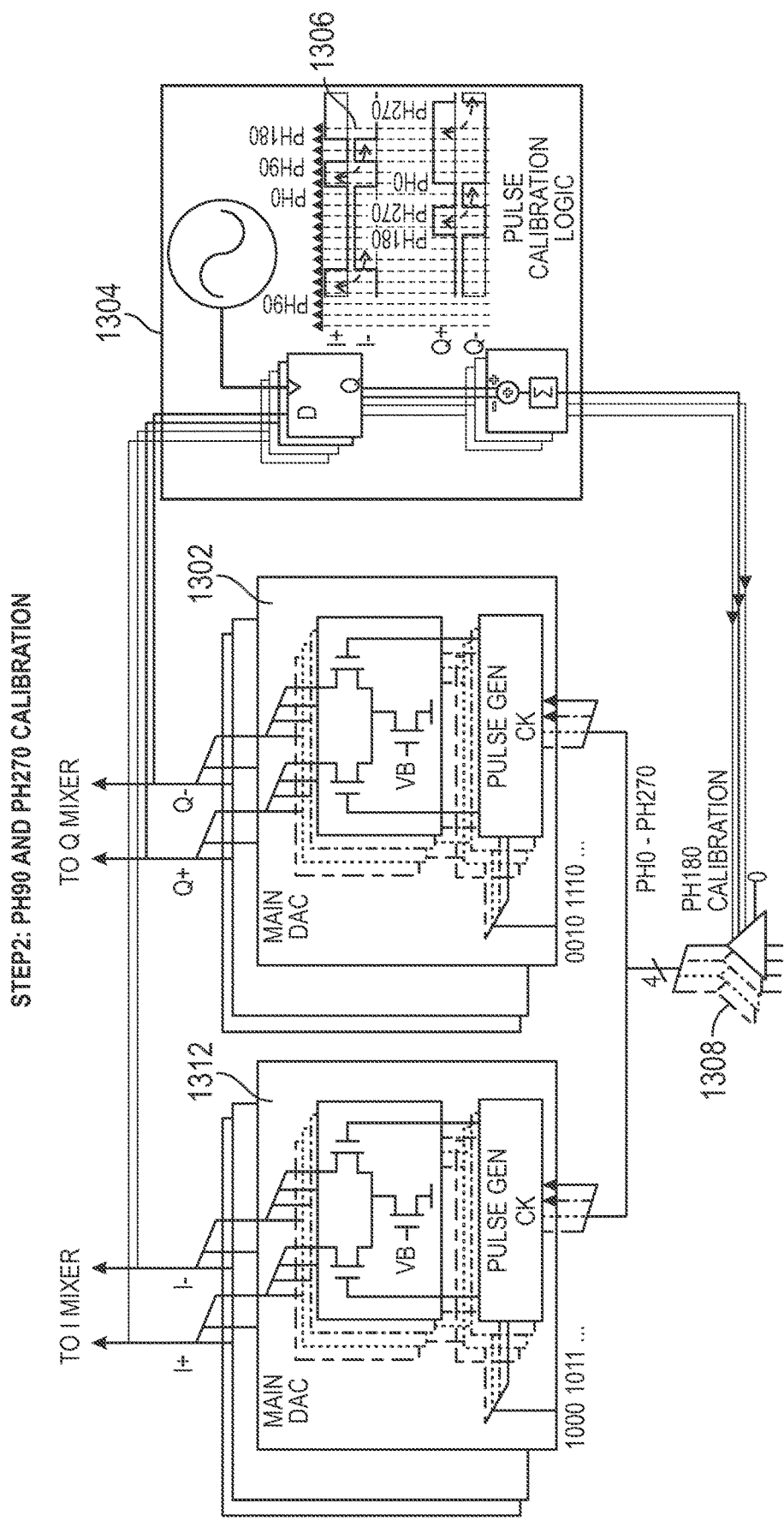

FIG. 13 illustrates a system 1300 for foreground DAC calibration according to some aspects. The system 1300 can include DAC 1302 and calibration circuitry 1304, wherein the calibration circuitry 1304 is similar to that described above with reference to FIG. 10.

Any random or systematic mismatch between the main DAC and the replica DAC can cause a detection error during the background calibration that was described above with reference to FIG. 11. Therefore, a foreground calibration may be more accurate as the main DAC 1302 can be directly re-purposed for calibration, assuming the mismatch is relatively static over supply and temperature variation.

In the system 1300, input test sequences 1306, 1310 can be used for foreground calibration. Sequences in multiples of four pulses should be used in aspects. In some examples, pulses can be kept at a same level for higher periods of time in cases of higher-speed DACs. Because the outputs of the main DAC 1302 are shorted together, only one signal at a time can be measured per DAC 1302 (or two signals at a time for a quadrature transmitter). Furthermore, because there are three clock phases (Ph90, Ph180, Ph270) to be corrected with respect to Ph0, the calibration loop is run twice in aspects, as shown in FIG. 13.

Figure 14:
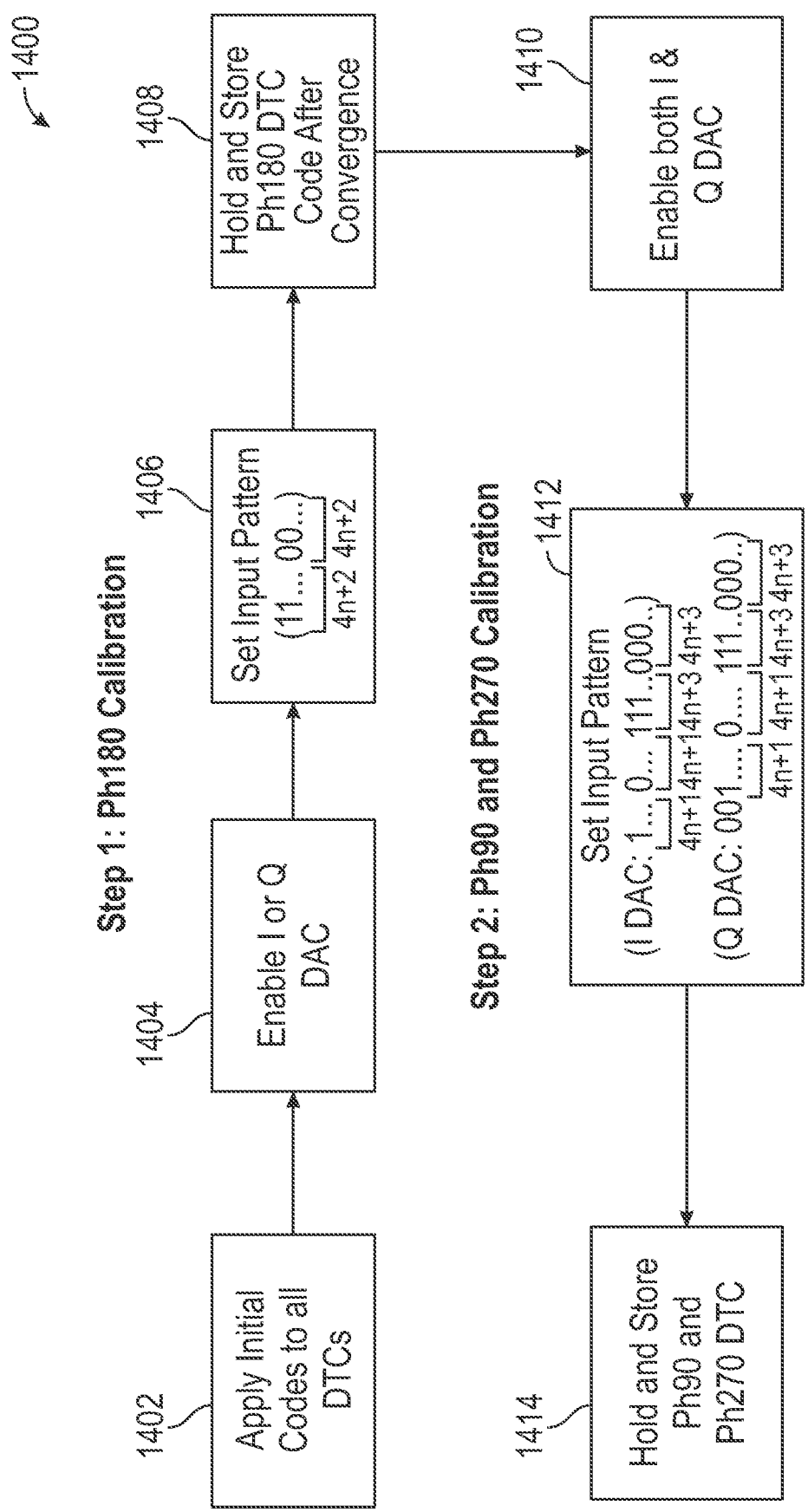
FIG. 14 illustrates a flowchart of a method for foreground DAC calibration according to some aspects.

With additional reference to FIG. 14, calibration operations can include operation 1402, in which calibration is initialized by applying an initial code to DTCs 1308. The initial code can comprise a set of bits, in aspects in the mid-code setting (e.g., for a 6-bit code ranging from 0-63, the initial code may be about 31). In operation 1404, one of the main DACs (e.g., a Q DAC 1302) is enabled. In operation 1406, a test sequence 1306 (e.g., a four-bit periodic sequence or any multiple of four bits) is applied as an input to the main DAC (e.g., Q DAC 1302 in the illustrated example). Q+ is then compared with Q−. Based on the test sequence 1306 used (e.g., 1100 in the illustrated example), Q+ is equivalent to pulse<0>+pulse<1> while Q− corresponds to pulse<2>+pulse<3>. If n>0 such that an integer multiple of four 1's and equal integer multiple of four 0's are added to the test pattern, the average reading of Q+ will still correspond to pulse<0>+pulse<1> and the average reading of Q− will still correspond to pulse<2>+pulse<3>. By adding multiples of four 1's balanced with four 0's to the test pattern, the average output reading remains unchanged. The Ph180 delay is then corrected in operation 1408 to ensure pulse<0>+pulse<1>=pulse<2>+pulse<3> after convergence. Subsequent to implementation of operations 1402 through 1408, the Ph180 edge appears at the center of two consecutive Ph0 edges, as will be discussed later herein with reference to FIG. 15.

In some aspects, an inverted test pattern (0011 . . . ) can be used after initial calibration to measure and correct for detector threshold mismatch for best accuracy. At least these aspects can be implemented by averaging Q+/Q− readings with the non-inverted sequence with corresponding Q−/Q+ readings from the inverted sequence to cancel mismatch in the detectors.

Next, operations are implemented to calibrate Ph90 and Ph270. In operation 1410, the other DAC (e.g., I DAC 1312 in the illustrated example) is enabled. In operation 1412 input data patterns 1310 (e.g., 1011 1000 . . . and 0010 1110 . . . ) are applied through the I and Q DAC respectively. In a transmitter with a single DAC, the second sequence could be applied in a third calibration operation. For the quadrature transmitter implementation shown in FIG. 13, I+ is compared with I− to correct Ph90 and Q+ is compared with Q− to correct Ph270 using the same calibration logic as described above with reference to FIG. 10. When the error in (I+)-(I−) is accumulated using the above pattern, the average weights in Pulse<0> to <3> become {+1, −1, 0, 0}. Therefore, the loop is converged when Pulse<0>=Pulse<1> and Ph90 aligns at the middle of Ph0 and Ph180.

Similarly, in the Q DAC the average Pulse<0> to Pulse<3> weights become {0, 0, +1, −1} making Pulse<2>=Pulse<3> when Ph270 appears exactly at the middle of Ph180 and Ph0. Combining all of the operations of method 1400 should give durations of Pulse<0>=Pulse<1>=Pulse<2>=Pulse<3>. In some aspects, longer test sequences can be used in cases in which the DAC output does not settle within one interval (due to, for example, inter-symbol interference (ISI)). In at least these situations, signal-dependent rise or fall time can impact the accuracy of error detection. To overcome this effect, a longer data pattern can be used to avoid 010 or 101 transition. This longer pattern can be created by adding a balance of 1's and 0's on each mux path. For example, a 10 pattern can be replaced by 1111100000 to avoid ISI while converging to the identical solution, wherein the number of ones and zeros are kept the same so that the same effective pattern is maintained. For example, the 10111000 test pattern (e.g., pattern 1310) can be modified to 1111100000111000 or 11111000001111111000000 to mitigate the impact of ISI.

Figure 15:
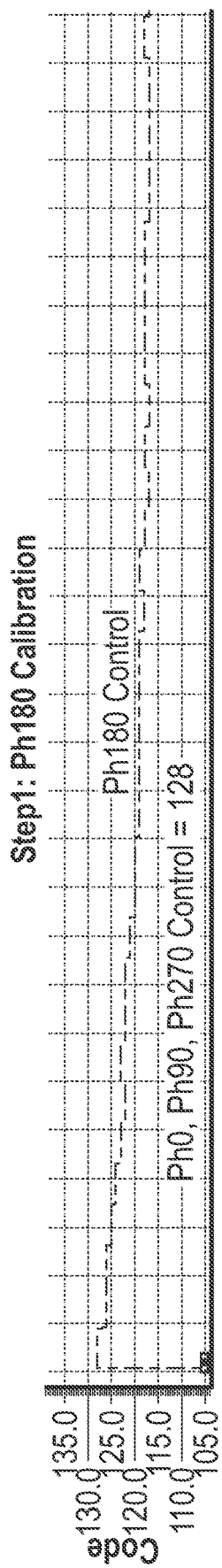
FIG. 15 illustrates a simulation of calibration signals using foreground DAC calibration according to some aspects.
Figure 15:
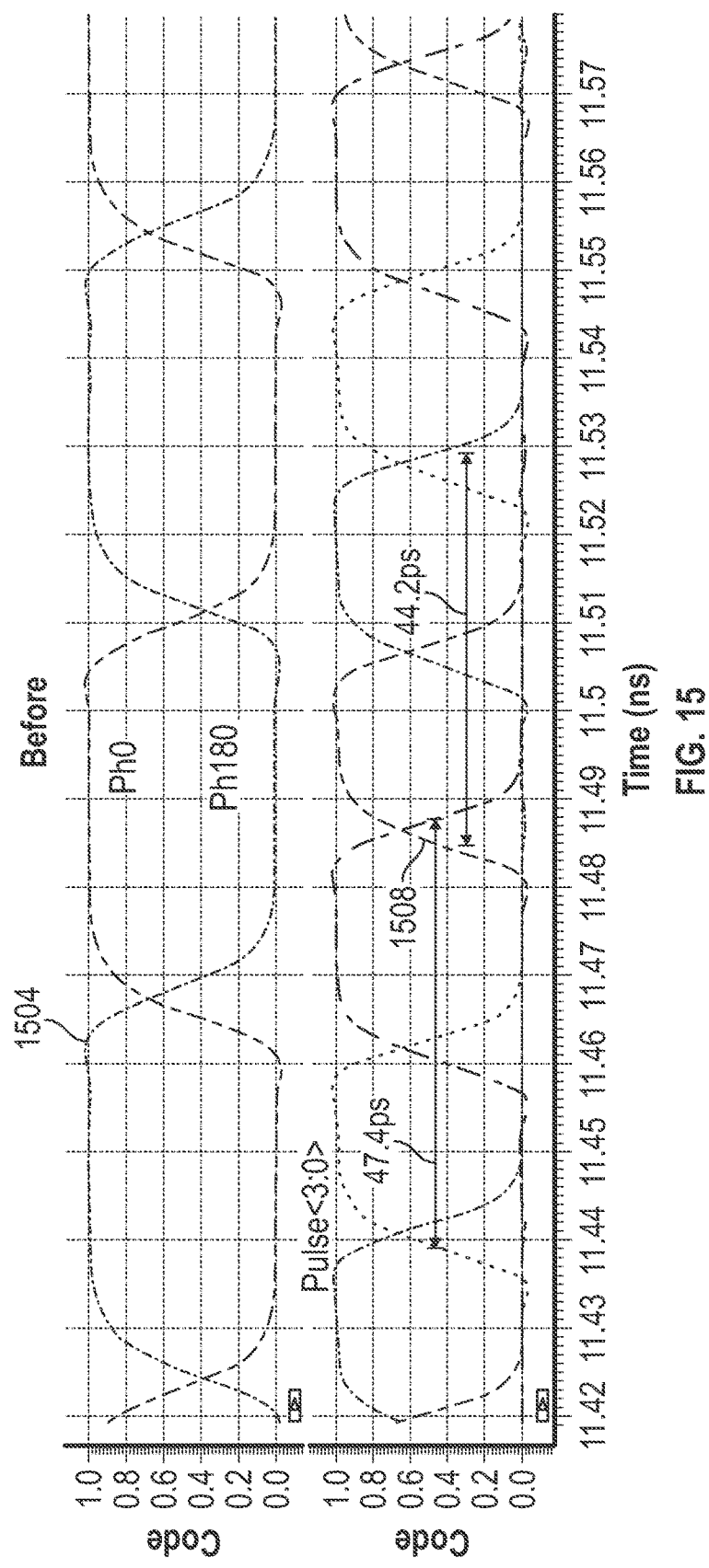
Figure 15:
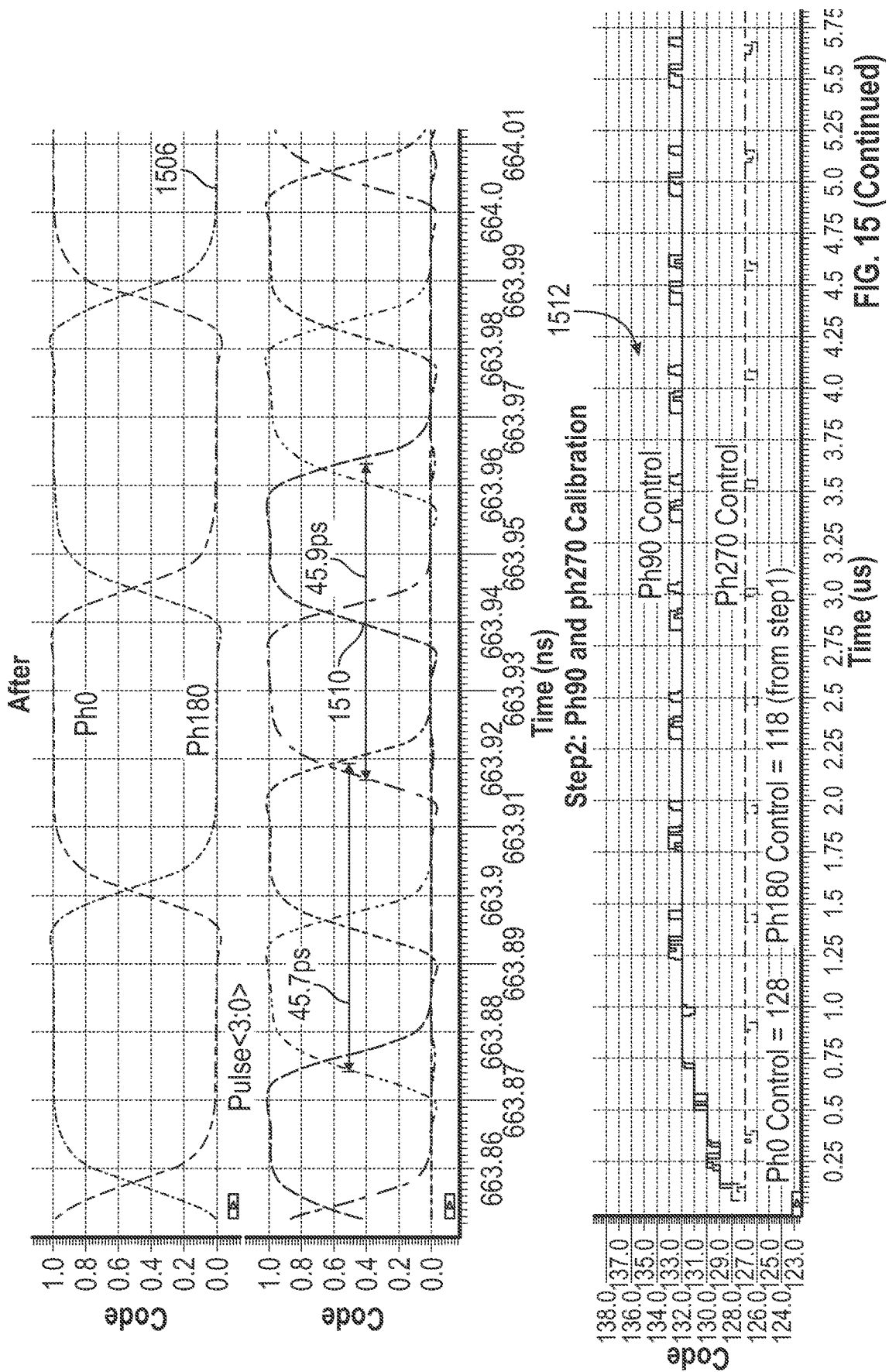
Figure 15:
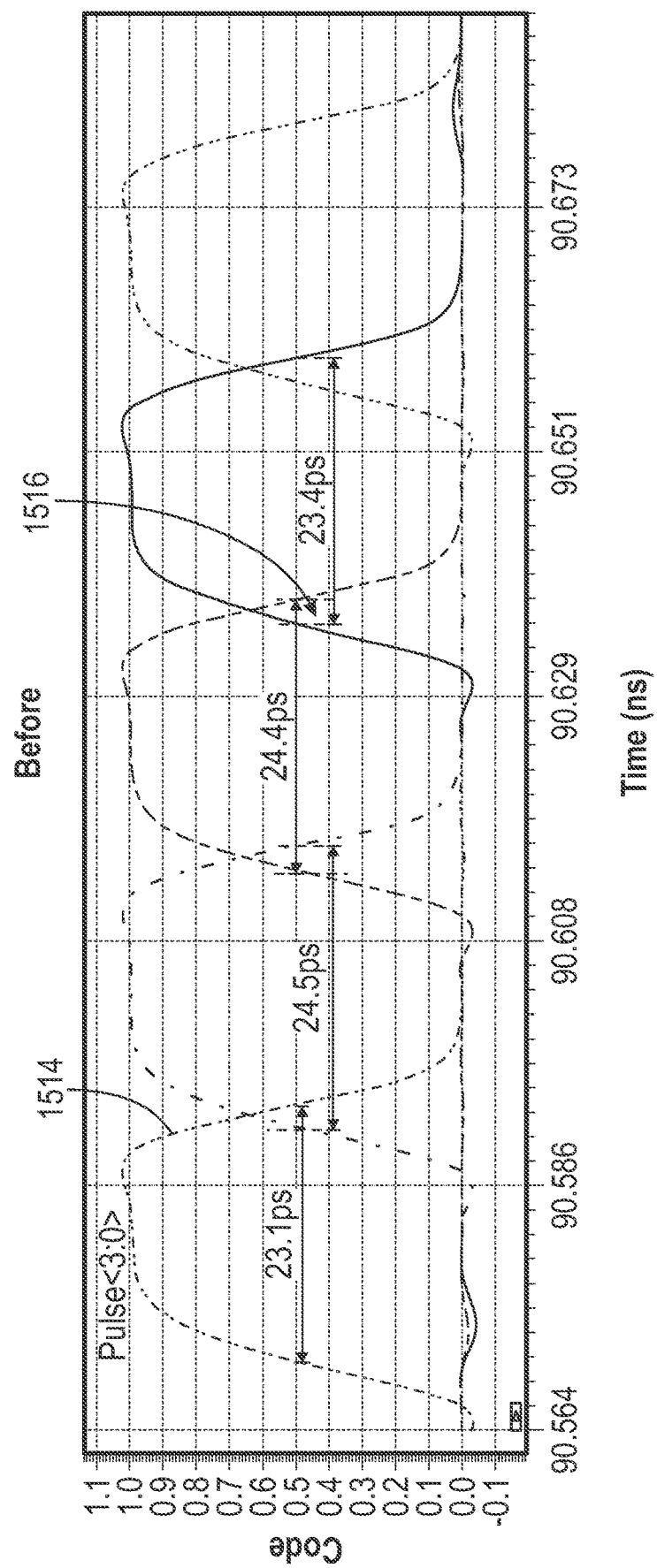
Figure 15:
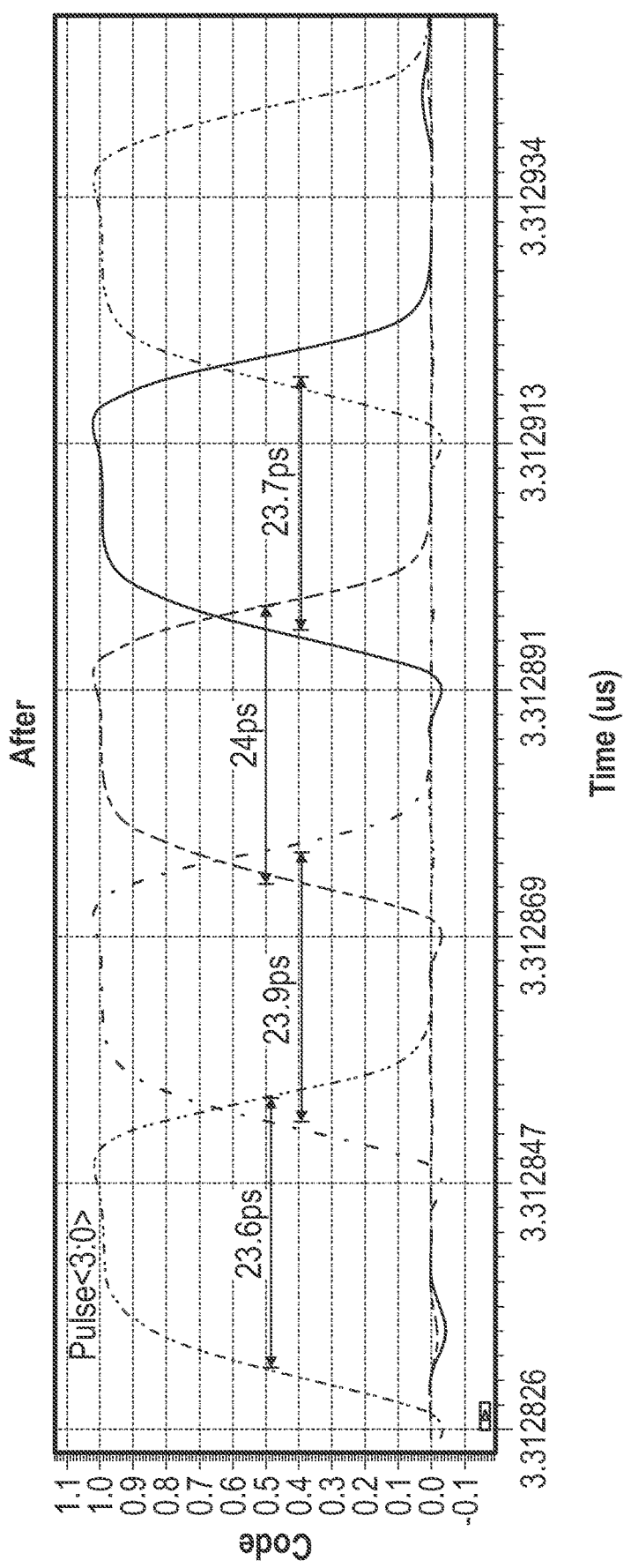

FIG. 15 illustrates a simulation of calibration signals using foreground DAC calibration according to some aspects. The curve labeled "Step1" in FIG. 15 illustrates the delay control code for Ph180 during operation 1406 of the calibration shown in FIG. 14. After sufficient time has passed, the Ph180 control code setting is relatively stable, indicating convergence. Phase signals before (curve 1504) and after (curve 1506) foreground DAC calibration are shown. As can be seen by comparing curves 1504 and 1506, Ph0 and Ph180 has originally has 3.2 picoseconds (ps) timing error 1508 which is corrected within 0.2 ps by operations 1402-1408, as shown at interval 1510.

Curve 1512 shows that the digital control code for Ph90 is adjusted to correct 1.4 ps timing error (see interval 1514) between Pulse<0> and Pulse<1>, and that the digital control code for Ph270 is adjusted to correct 1 ps timing error (given at interval 1516) between Pulse<2> and Pulse<3>, for a final maximum timing error of 0.4 ps (given in the chart 1518 to the right).

Other Systems and Apparatuses

Figure 16:
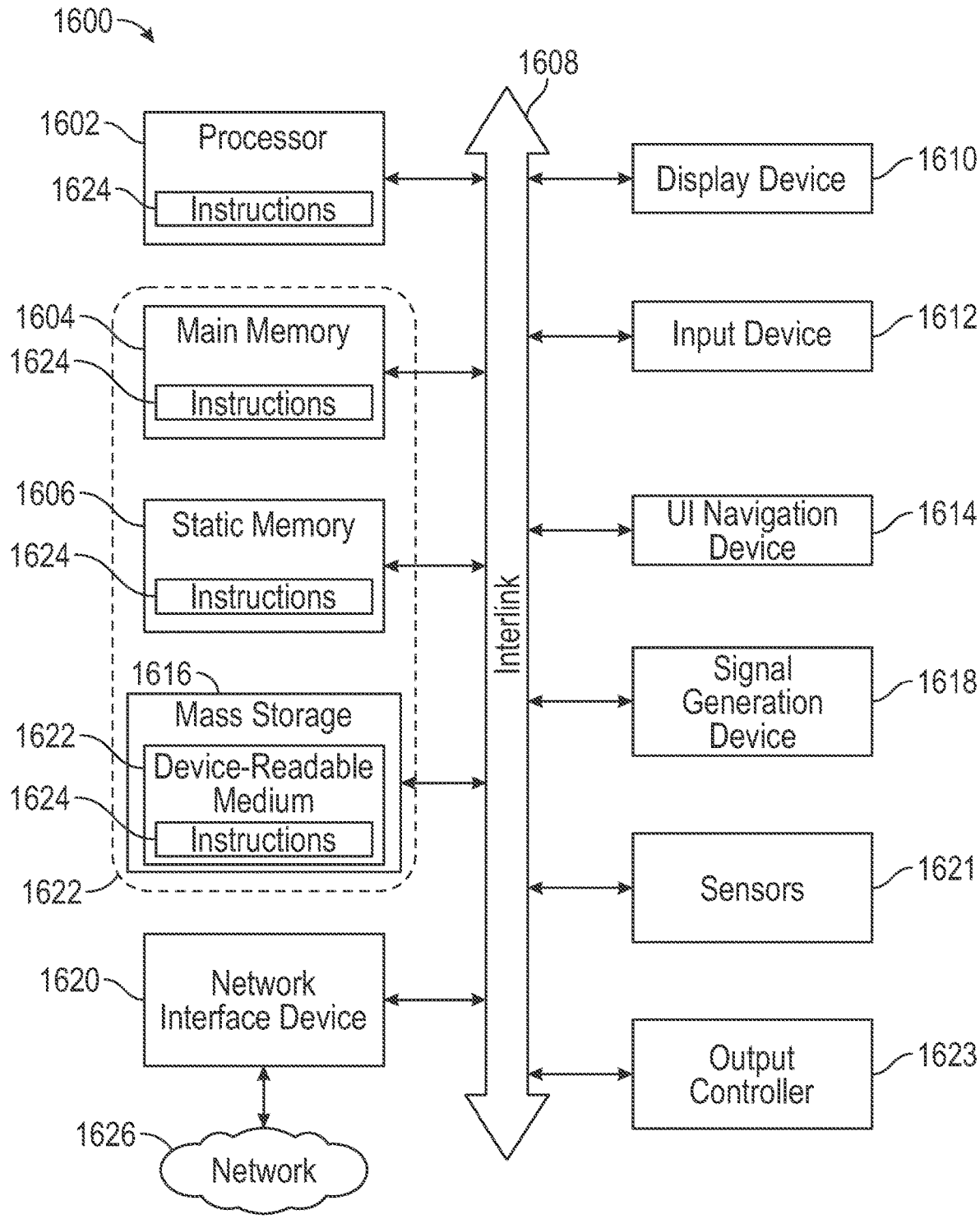
FIG. 16 illustrates a block diagram of a communication device such as an evolved Node-B (eNB), a new generation Node-B (gNB), an access point (AP), a wireless station (STA), a mobile station (MS), or a user equipment (UE), in accordance with some aspects.

FIG. 16 illustrates a block diagram of a communication device 1600 such as an evolved Node-B (eNB), a new generation Node-B (gNB), an access point (AP), a wireless station (STA), a mobile station (MS), or a user equipment (UE), in accordance with some aspects. In alternative aspects, the communication device 1600 may operate as a standalone device or may be connected (e.g., networked) to other communication devices. In some aspects, the communication device 1600 can use one or more of the techniques and circuits discussed herein, in connection with any of FIG. 1-FIG. 15.

Circuitry (e.g., processing circuitry) is a collection of circuits implemented in tangible entities of the device 1600 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation.

In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the device 1600 follow.

In some aspects, the device 1600 may operate as a standalone device or may be connected (e.g., networked) to other devices. In a networked deployment, the communication device 1600 may operate in the capacity of a server communication device, a client communication device, or both in server-client network environments. In an example, the communication device 1600 may act as a peer communication device in peer-to-peer (P2P) (or other distributed) network environment. The communication device 1600 may be a UE, eNB, PC, a tablet PC, a STB, a PDA, a mobile telephone, a smart phone, a web appliance, a network router, switch or bridge, or any communication device capable of executing instructions (sequential or otherwise) that specify actions to be taken by that communication device. Further, while only a single communication device is illustrated, the term "communication device" shall also be taken to include any collection of communication devices that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software e.g., instructions, an application portion, or an application) as a module that operates to perform specified operations. In an example, the software may reside on a communication device-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device (e.g., UE) 1600 may include a hardware processor 1602 (e.g., a central processing unit (CPU), a graphics processing unit (GPU), a hardware processor core, or any combination thereof), a main memory 1604, a static memory 1606, and mass storage device 1616 (e.g., hard drive, tape drive, flash storage, or other block or storage devices), some or all of which may communicate with each other via an interlink (e.g., bus) 1608.

The communication device 1600 may further include a display unit 1610, an alphanumeric input device 1612 (e.g., a keyboard), and a user interface (UI) navigation device 1614 (e.g., a mouse). In an example, the display unit 1610, input device 1612 and UI navigation device 1614 may be a touch screen display. The communication device 1600 may additionally include a signal generation device 1618 (e.g., a speaker), a network interface device 1620, and one or more sensors 1621, such as a global positioning system (UPS) sensor, compass, accelerometer, or other sensor. The communication device 1600 may include an output controller 1623, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The mass storage device 1616 may include a communication device-readable medium 1622, on which is stored one or more sets of data structures or instructions 1624 (e.g., software) embodying or utilized by any one or more of the techniques or functions described herein. In some aspects, registers of the processor 1602, the main memory 1604, the static memory 1606, and/or the mass storage device 1616 may be, or include (completely or at least partially), the device-readable medium 1622, on which is stored the one or more sets of data structures or instructions 1624, embodying or utilized by any one or more of the techniques or functions described herein. In an example, one or any combination of the hardware processor 1602, the main memory 1604, the static memory 1606, or the mass storage device 1616 may constitute the device-readable medium 1822.

As used herein, the term "device-readable medium" is interchangeable with "computer-readable medium" or "machine-readable medium". While the communication device-readable medium 1622 is illustrated as a single medium, the term "communication device-readable medium" may include a single medium or multiple media (e.g., a centralized or distributed database, and/or associated caches and servers) configured to store the one or more instructions 1624.

The term "communication device-readable medium" may include any medium that is capable of storing, encoding, or carrying instructions for execution by the communication device 1600 and that cause the communication device 1600 to perform any one or more of the techniques of the present disclosure, or that is capable of storing, encoding or carrying data structures used by or associated with such instructions. Non-limiting communication device-readable medium examples may include solid-state memories, and optical and magnetic media. Specific examples of communication device-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, communication device-readable media may include non-transitory communication device-readable media. In some examples, communication device-readable media may include communication device-readable media that is not a transitory propagating signal.

The instructions 1624 may further be transmitted or received over a communications network 1626 using a transmission medium via the network interface device 1620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1620 may include one or more physical jacks (e.g., Ethernet, coaxial, or phone jacks) or one or more antennas to connect to the communications network 1626. In an example, the network interface device 1620 may include a plurality of antennas to wirelessly communicate using at least one of single-input multiple-output (SIMO), MIMO, or multiple-input single-output (MISO) techniques. In some examples, the network interface device 1620 may wirelessly communicate using Multiple User MIMO techniques.

The term "transmission medium" shall be taken to include any intangible medium that is capable of storing, encoding, or carrying instructions for execution by the communication device 1600, and includes digital or analog communications signals or other intangible medium to facilitate communication of such software. In this regard, a transmission medium in the context of this disclosure is a device-readable medium.

Figure 17:
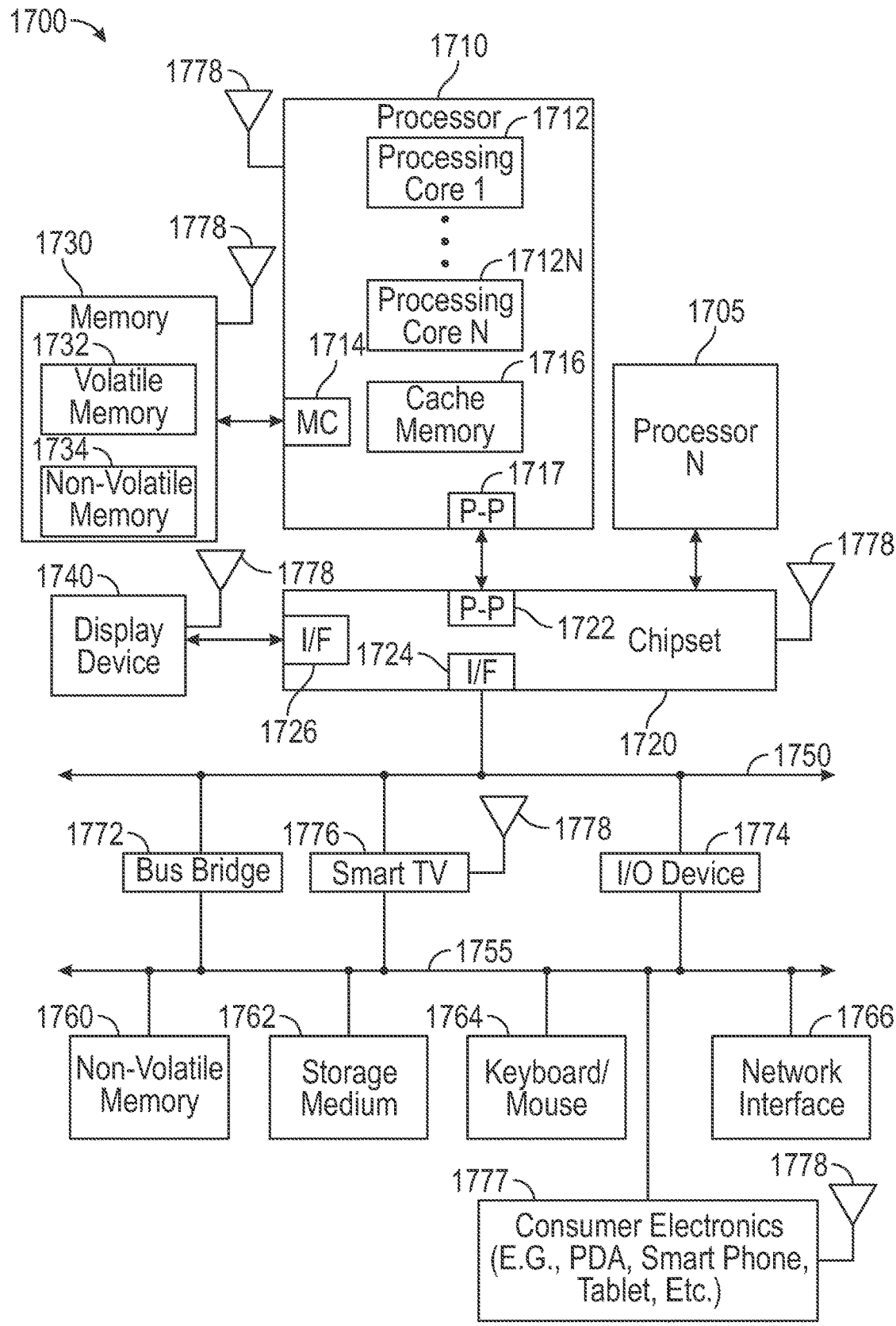
FIG. 17 illustrates a system level diagram, depicting an example of an electronic device (e.g., system) that can include, for example, a transmitter configured to selectively fan out a signal to one of multiple communication channels.

FIG. 17 illustrates a system level diagram, depicting an example of an electronic device (e.g., system) that can include, for example, a transmitter configured to selectively fan out a signal to one of multiple communication channels. FIG. 17 is included to show an example of a higher-level device application for the subject matter discussed above with regards to FIGS. 1-15. In one aspect, system 1700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some aspects, system 1700 is a system on a chip (SOC) system.

In one aspect, processor 1710 has one or more processor cores 1712, . . . , 1712N, where 1712N represents the Nth processor core inside processor 1710 where N is a positive integer. In one aspect, system 1700 includes multiple processors including 1710 and 1705, where processor 1705 has logic similar or identical to the logic of processor 1710. In some aspects, processing core 1712 includes, but is not limited to, pre-fetch logic to fetch instructions, decode logic to decode the instructions, execution logic to execute instructions and the like. In some aspects, processor 1710 has a cache memory 1716 to cache instructions and/or data for system 1700. Cache memory 1716 may be organized into a hierarchal structure including one or more levels of cache memory.

In some aspects, processor 1710 includes a memory controller 1714, which is operable to perform functions that enable the processor 1710 to access and communicate with memory 1730 that includes a volatile memory 1732 and/or a non-volatile memory 1734. In some aspects, processor 1710 is coupled with memory 1730 and chipset 1720. Processor 1710 may also be coupled to a wireless antenna 1778 to communicate with any device configured to transmit and/or receive wireless signals. In one aspect, an interface for wireless antenna 1778 operates in accordance with, but is not limited to, the IEEE 802.11 standard and its related family, Home Plug AV (HPAV), Ultra Wide Band (UWB), Bluetooth, WiMax, or any form of wireless communication protocol.

In some aspects, volatile memory 1732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1734 includes, but is not limited to, flash memory, phase change memory (PCM), read-only memory (ROM), electrically erasable programmable read-only memory (EEPROM), or any other type of non-volatile memory device.

Memory 1730 stores information and instructions to be executed by processor 1710. In one aspect, memory 1730 may also store temporary variables or other intermediate information while processor 1710 is executing instructions. In the illustrated aspect, chipset 1720 connects with processor 1710 via Point-to-Point (PtP or P-P) interfaces 1717 and 1722. Chipset 1720 enables processor 1710 to connect to other elements in system 1700. In some aspects of the example system, interfaces 1717 and 1722 operate in accordance with a PtP communication protocol such as the Intel®

QuickPath Interconnect (OPI) or the like. In other aspects, a different interconnect may be used.

In some aspects, chipset 1720 is operable to communicate with processor 1710, 1705N, display device 1740, and other devices, including a bus bridge 1772, a smart TV 1776, I/O devices 1774, nonvolatile memory 1760, a storage medium (such as one or more mass storage devices) 1762, a keyboard/mouse 1764, a network interface 1766, and various forms of consumer electronics 1777 (such as a PDA, smart phone, tablet etc.), etc. In one aspect, chipset 1720 couples with these devices through an interface 1724. Chipset 1720 may also be coupled to a wireless antenna 1778 to communicate with any device configured to transmit and/or receive wireless signals.

Chipset 1720 connects to display device 1740 via interface 1726. Display device 1740 may be, for example, a liquid crystal display (LCD), a plasma display, cathode ray tube (CRT) display, or any other form of visual display device. In some aspects of the example system, processor 1710 and chipset 1720 are merged into a single SOC. In addition, chipset 1720 connects to one or more buses 1750 and 1755 that interconnect various system element such as I/O devices 1774, nonvolatile memory 1760, storage medium 1762, a keyboard/mouse 1764, and network interface 1766. Buses 1750 and 1755 may be interconnected together via a bus bridge 1772.

In one aspect, storage medium 1762 includes, but is not limited to, a solid-state drive, a hard disk drive, a universal serial bus flash memory drive, or any other form of computer data storage medium. In one aspect, network interface 1766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one aspect, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 17 are depicted as separate blocks within the system 1700, the functions performed by some of these blocks may be integrated within a single semiconductor circuit or may be implemented using two or more separate integrated circuits. For example, although cache memory 1716 is depicted as a separate block within processor 1710, cache memory 1716 (or selected aspects of 1716) can be incorporated into processor core 1712.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may, for example, be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks—Specific requirements Part 11: Wireless LAN Medium Access Control (MAC) and Physical Layer (PRY) Specifications, Dec. 7, 2016); IEEE 802.11ay (P802.11ay Standard for Information Technology—Telecommunications and Information Exchange Between Systems Local and Metropolitan Area Networks—Specific Requirements Part 11: Wireless LAN Medium Access Control (MAC) and Physical Layer (PHY) Specifications—Amendment: Enhanced Throughput for Operation in License-Exempt Bands Above 45 GHz)) and/or future versions and/or derivatives thereof, devices and/or networks operating in accordance with existing WiFi Alliance (WFA) Peer-to-Peer (P2P) specifications (including WiFi P2P technical specification, version 1.5, Aug. 4, 2015) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SOMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device and may not necessarily include the action of receiving the signal by a second device. In another example, the phrase "communicating a signal" may refer to the action of receiving the signal by a first device and may not necessarily include the action of transmitting the signal by a second device.

Some demonstrative aspects may be used in conjunction with a wireless communication network communicating over a frequency band above 45 Gigahertz (GHz), e.g., 60 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a frequency band above 45 GHz, a frequency band below 20 GHz, e.g., a Sub 1 GHz (SIG) band, a 2.4 GHz band, a 5 GHz band, a WLAN frequency band, a WPAN frequency band, a frequency band according to the WGA specification, and the like.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, circuitry may include logic, at least partially operable in hardware. In some aspects, the circuitry may be implemented as part of and/or in the form of a radio virtual machine (RVM), for example, as part of a Radio processor (RP) configured to execute code to configured one or more operations and/or functionalities of one or more radio components.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna" or "antenna array", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

ADDITIONAL NOTES AND ASPECTS

Example 1 is an apparatus comprising: a digital-to-analog converter (DAC); calibration circuitry including an oscillator, the calibration circuitry coupled to an output of the DAC, the calibration circuitry configured to: sample and count DAC output pulses for at least two consecutive pulses using at least two separate counter circuits, determine error between at least two consecutive pulses, and provide a correction value based on the error; and correction circuitry to provide a calibration signal to the DAC based on the correction value.

In Example 2, the subject matter of Example 1 can optionally include wherein the oscillator includes a ring oscillator.

In Example 3, the subject matter of any of Example 1-2 can optionally include wherein the oscillator oscillates out of phase with clock circuitry of the DAC.

In Example 4, the subject matter of any of Example 1-3 can optionally include wherein the at least two separate counter circuits each comprise D-flip-flop circuitry to drive a digital accumulator.

In Example 5, the subject matter of any of Example 1-4 can optionally include wherein the at least two separate counter circuits each comprise phase detector circuitry.

In Example 6, the subject matter of any of Example 1-5 can optionally include wherein the apparatus further comprises circuitry to control at least one of rising edges and falling edges of DAC control clocks using outputs of the at least two separate counter circuits to equalize a width of final DAC pulses.

In Example 7, the subject matter of any of Example 1-6 can optionally include wherein the DAC is included in a replica DAC separate from operating DACs of a wireless device that includes the apparatus.

In Example 8, the subject matter of any of Example 1-7 can optionally include wherein the DAC is an operating DAC of a wireless device that includes the apparatus.

Example 9 is a method for calibrating a digital-to-analog converter (DAC), the method comprising: sampling and counting DAC output pulses for at least two consecutive pulses using at least two separate counter circuits; determining error between at least two consecutive pulses; providing a correction value based on the error; and providing a calibration signal to the DAC based on the correction value.

In Example 10, the subject matter of Example 9 can optionally include wherein the sampling and counting includes providing an oscillator output out of phase with clock circuitry of the DAC.

In Example 11, the subject matter of any of Example 9-10 can optionally include wherein the counting comprises driving a digital accumulator with two separate D-flip-flop circuitry components.

In Example 12, the subject matter of any of Example 9-11 can optionally include controlling at least one of rising edges and falling edges of DAC control clocks using outputs of the at least two separate counter circuits to equalize a width of final DAC pulses.

Example 13 is a wireless communication device comprising at least one main digital-to-analog converter (DAC); and a replica DAC coupled to calibration circuitry, the calibration circuitry including an oscillator, the calibration circuitry coupled to an output of the replica DAC, the calibration circuitry configured to: sample and count DAC output pulses for at least two consecutive pulses using at least two separate counter circuits, determine error between at least two consecutive pulses, and provide a correction value to the replica DAC based on the error.

In Example 14, the subject matter of Example 13 can optionally include at least two main DACs.

In Example 15, the subject matter of Example 14 can optionally include wherein at least one main DAC is a Q DAC and another DAC is an DAC.

In Example 16, the subject matter of Example 15 can optionally include an I mixer coupled to an output of the I DAC and a Q mixer coupled to an output of the Q DAC.

In Example 17, the subject matter of Example 13 can optionally include a digital-to-time converter (DTC) to independently correct each phase of the at least one main DAC based on an output of the calibration circuitry.

Example 18 is a method for calibration of a digital to analog converter (DAC), the method comprising: providing an input pattern to calibration circuitry coupled to the DAC; correcting for a time delay of a first phase of the DAC converter based on the input pattern to generate a corrected first phase; and correcting for a time delay in at least a second phase of the DAC based on the corrected first phase.

In Example 19, the subject matter of Example 18 can optionally include wherein correcting for the time delay of the first phase comprises correcting for the time delay in one DAC of a two-DAC system.

In Example 20, the subject matter of Example 19 can optionally include wherein correcting for a time delay in at least the second phase comprises correcting for the time delay in a second DAC of the two-DAC system.

Example 21 is a system include means for performing any of Examples 1-20.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the full scope of equivalents to which such claims are legally entitled.

What is claimed is:

1. An apparatus comprising:
a digital-to-analog converter (DAC);
calibration circuitry including an oscillator, the calibration circuitry coupled to an output of the DAC, the calibration circuitry configured to:
   sample and count DAC output pulses for at least two consecutive pulses using at least two separate counter circuits,
   determine error between at least two consecutive pulses, and
   provide a correction value based on the error; and
correction circuitry to provide a calibration signal to the DAC based on the correction value.

2. The apparatus of claim 1, wherein the oscillator includes a ring oscillator.

3. The apparatus of claim 1, wherein the oscillator oscillates out of phase with clock circuitry of the DAC.

4. The apparatus of claim 1, wherein the at least two separate counter circuits each comprise D-flip-flop circuitry to drive a digital accumulator.

5. The apparatus of claim 1, wherein the at least two separate counter circuits each comprise phase detector circuitry.

6. The apparatus of claim 1, wherein the apparatus further comprises circuitry to control at least one of rising edges and falling edges of DAC control clocks using outputs of the at least two separate counter circuits to equalize a width of final DAC pulses.

7. The apparatus of claim 1, wherein the DAC is included in a replica DAC separate from operating DACs of a wireless device that includes the apparatus.

8. The apparatus of claim 1, wherein the DAC is an operating DAC of a wireless device that includes the apparatus.

9. A method for calibrating a digital-to-analog converter (DAC), the method comprising:
sampling and counting DAC output pukes for at least two consecutive pulses using at least two separate counter circuits;
determining error between at least two consecutive pulses;
providing a correction value based on the error; and
providing a calibration signal to the DAC based on the correction value.

10. The method of claim 9, wherein the sampling and counting includes providing an oscillator output out of phase with clock circuitry of the DAC.

11. The method of claim 9, wherein the counting comprises driving a digital accumulator with two separate D-flip-flop circuitry components.

12. The method of claim 9, further comprising controlling at least one of rising edges and falling edges of DAC control clocks using outputs of the at least two separate counter circuits to equalize a width of final DAC pulses.

13. A wireless communication device comprising:
at least one main digital-to-analog converter (DAC); and
a replica DAC coupled to calibration circuitry, the calibration circuitry including an oscillator, the calibration circuitry coupled to an output of the replica DAC, the calibration circuitry configured to:
   sample and count DAC output pulses for at least two consecutive pulses using at least two separate counter circuits,
   determine error between at least two consecutive pulses, and
   provide a correction value to the replica DAC based on the error.

14. The wireless communication device of claim 13, comprising at least two main DACs.

15. The wireless communication device of claim 14, wherein at least one main DAC is a Q DAC and another DAC is an DAC.

16. The wireless communication device of claim 15, further comprising an I mixer coupled to an output of the I DAC and a Q mixer coupled to an output of the Q DAC.

17. The wireless communication device of claim 13, further comprising a digital-to-time converter (DTC) to independently correct each phase of the at least one main DAC based on an output of the calibration circuitry.

18. A method for calibration of a digital to analog converter (DAC), the method comprising:
providing an input pattern to calibration circuitry coupled to the DAC;
correcting for a time delay of a first phase of the DAC converter based on the input pattern to generate a corrected first phase; and
correcting for a time delay in at least a second phase of the DAC based on the corrected first phase.

19. The method of claim 18, wherein correcting for the time delay of the first phase comprises correcting for the time delay in one DAC of a two-DAC system.

20. The method of claim 19, wherein correcting for a time delay in at least the second phase comprises correcting for the time delay in a second DAC of the two-DAC system.

* * * * *